United States Patent [19]

Ngo et al.

[11] Patent Number: 5,694,474

[45] Date of Patent: Dec. 2, 1997

[54] ADAPTIVE FILTER FOR SIGNAL PROCESSING AND METHOD THEREFOR

[75] Inventors: John-Thomas Calderon Ngo, Sunnyvale; Neal Ashok Bhadkamkar, Palo Alto, both of Calif.

[73] Assignee: Interval Research Corporation, Palo Alto, Calif.

[21] Appl. No.: 529,370

[22] Filed: Sep. 18, 1995

[51] Int. Cl.$^6$ .............................. H04B 3/20; H04B 15/00
[52] U.S. Cl. ................................. 381/66; 381/92; 381/94; 364/724.19
[58] Field of Search .............................. 381/94, 66, 71, 381/92; 364/724.19; 379/388, 410

[56] References Cited

U.S. PATENT DOCUMENTS

| | | |
|---|---|---|
| 4,581,758 | 4/1986 | Coker et al. . |
| 4,750,147 | 6/1988 | Roy, III et al. . |
| 4,751,738 | 6/1988 | Widrow et al. . |
| 5,465,302 | 11/1995 | Lazzari et al. ............................ 381/92 |

OTHER PUBLICATIONS

G. Edwards of GD Associates (1994) (newsclipping –Jun. 19, 1994).

J.L. Flanagan et al., "Computer–steered microphone arrays for sound transduction in large rooms", Journal of the Acoustical Society of America, 78(5), pp. 1508–1518, 1985.

N. Sugie et al. "Localizing Sound Source by Incorporating Biological Auditory Mechanism", IEEE Int'l Conf. on Neural Networks, 11–243–250, 1988.

Y. Kaneda, "Sound source localization for wide–band signals under a reverberant condition", J. Acoust. Soc. Jpn. (E) 14, 1 (1993), pp. 47–48.

N. Bhadkamkar et al. "A Sound Localization System Based on Biological Analogy", Elec.Engineering Dept., Stanford University (1993).

T. Morita, "Separation of Mixed Voices by Acoustic Parameter Optimization", Electronics and Communications in Japan, Part 3: Fundamental Electronic Science 74(5), 30–38, 1991.

R.O. Schmidt, "A Signal Subspace Approach to Multiple Emitter Location and Spectral Estimation", Ph.D. dissertation, Stanford University, Stanford, CA 1981.

(List continued on next page.)

*Primary Examiner*—Forester W. Isen
*Attorney, Agent, or Firm*—Limbach & Limbach LLP; Ronald L. Yin

[57] ABSTRACT

This invention is a component of an adaptive filter signal processor whose purpose is to separate a mixture of signals received by each of a plurality of transducers. This invention accomplishes a key step in that separation: it estimates, from the transducer signals, the relative propagation delays among the transducers for each source. First, it randomly generates a fixed number of sets of delay parameters, called a population. Thereafter, the following events occur at each clock cycle. Each set is processed by an instantaneous-performance calculator, to generate an instantaneous-performance value. The instantaneous performance value of each set is added to a cumulative performance value. The set with the greatest cumulative performance value is transferred to the adaptive filter signal processor. New parameter sets are generated at random. Whenever a parameter set is found whose instantaneous performance value exceeds that of the set in the population with the least instantaneous performance value, it is incorporated into the population. The set with the least cumulative performance value is deleted from the population, and the new parameter set is assigned an initial cumulative performance value that falls short of the greatest cumulative performance value in the population by a fixed amount.

72 Claims, 4 Drawing Sheets

Microfiche Appendix Included
(1 Microfiche, 46 Pages)

OTHER PUBLICATIONS

J.L. Lacoume and P.Ruiz, "Separation of Independent Sources from Correlated Inputs", IEEE Trans. Signal Processing 40(12), Dec. 1992.

E. Moulines, J–F. Cardoso, "Direction Finding Algorithms Using Fourth Order Statistics. Asymptotic Performance Analysis", ICASSP '92, vol. II, 437–440, 1992.

J.Herault, C. Jutten, "Space or Time Adaptive Signal Processing by Neural Network Models", Neural Networks for Computing, AIP Conference Proceedings 151, 1986, pp. 206–211.

L. Tong et al. "Eigenstructure–Based Blind Identification of Independent Signals", IEEE, 1991, pp. 3329–3332.

L. Tong et al. "Indeterminacy and Identifiability of Blind Identification", IEEE Trans. on Circuits and Systems, vol. 38, No. 5, May 1991, pp. 499–509.

K. Abed–Meraim et al. "Asymptotic Performance of Second Order Blind Separation", IEEE, 1994, pp. IV–277 to IV–280.

S. Van Gerven et al. "On the Use of Decorrelation in Scalar Signal Separation", IEEE, 1994, pp. III–57 to III–60.

L. Molgedey et al. "Separation of a Mixture of Independent Signals Using Time Delayed Correlations", Physical Review Letters 72(23), 3634–3637,Jun. 6, 1994.

J. Platt et al. "Networks for the Separation of Sources that are Superimposed and Delayed", NIPS '91, pp. 730–737, 1992.

Y. Bar–Ness "Broadband Interference Cancelation Using a Bootstrapped Approach", IEEE, Apr. 1993, pp. III–372–375.

C. Jutten et al. "Blind Separation of Sources : an Algorithm for Separation of Convolutive Mixtures", Higher Order Statistics, 275–278, 1992.

D. Van Compernolle et al. "Signal Separation in a Symmetric Adaptive Noise Canceler by Output Decorrelation", Sep. 1992, IV–221–224.

A. Dinc et al. "A Forward/Backward Bootstrapped Structure for Blind Separation of Signals in a Multi–Channel Dispersive Environment", IEEE 1993, Apr. 1993, pp. III–376–379.

M. Najar, et al. "Blind Wideband Source Separation", 1994 IEEE, 1994, pp. IV–65–68.

M. Cohen, "Analog VLSI Implementation of an Auto––Adaptive Synthetic Neural Network for Real–Time Separation of Independent Signal Sources", Master's Thesis, John Hopkins University, May 1991.

R. Nambiar et al., "Genetic and Learning Automata Algorithms for Adaptive Digital Filters", IEEE, 1992, pp. IV–41–44.

S.J. Flockton et al., "Pole–zero System Identification Using Genetic Algorithms", Fifth International Conference on Genetic Algorithms, 531–535 (1993).

S.C. Ng et al. "Fast Convergent Search for Adaptive IIR Filtering", ICASSP '94, III:105–108 (1994).

D.L. Calloway, "Constructing an optimal binary phase–only filter using a genetic algorithm", SPIE vol. 1564 Optical Information Proc. Systemss and Arch, pp. 395–402, (1991).

D.M. Etter et al. "Recursive Adaptive Filter Design Using an Adaptive Genetic Algorithm", Dept. of Electrical/Computer Eng., Univ. of New Mex., Jul. 1982, pp. 635–638.

T. Eisenhammer et al., "Optimization of Interference Filters with Genetic Algorithms Applied to Silver–Based Heat Mirrors", Applied Optics, vol. 32, No. 31, 1 Nov. 1993, pp. 6310–6315.

E. Michielssen et al. "Optimal multilayer filter design using real coded genetic algorithms", IEEE Proceedings, J. vol. 139, No 6, Dec. 1993, pp. 413–420.

D. Suckley, "Genetic Algorithm in the Design of FIR Filters", 1992.

D.J. Xu, "Design of Finite Word Length FIR Digital Filter Using a Parallel Genetic Algorithm", Proceedings: IEEE Southeastern 92, vol. 122, pp. 834–837 (Apr. 1992).

R. Nambiar et al. "Genetic and Annealing Approaches to Adaptive Digital Filtering", 1992 IEEE, pp. 871–875.

O.V. Patiakin et al., "An Adaptive Filter Using Darwinian Algorithm for System Identification and Control", International Conf. on Systems, Man. & Cybernetics, Oct. 1993, vol. 4, pp. 627–631.

S.D. Stearns et al. "A Survey of IIR Adaptive Filtering Algorithms", 1982, Proc. IEEE International Symp. on Cir. and Systems, pp. 709–711.

Product Spec. Sheet, "Knowles CF 2949 Data Sheet", Knowles Electronics Inc., Itasca, IIL R. Roy, "ESPRIT —Estimation of Signal Parameters via Rotational Invariance Techniques," Ph.D. dissertation, Stanford University, Stanford, CA, 1987.

J.A. Allen, "Advanced Beamforming Concepts: Source Localization Using the Bispectrum, Gabor Transform, Wigner–Ville Distribution, and Nonstationary Signal Representations", 25th Asilomar Conf. on Signals, System & Computers, Nov. 1991, IEEE Computer Society, pp. 818–824.

Widrow & Stearns, "Adaptive Signal Processing", 1985, p. 99.

W. Siebert "Circuits, Signals and Systems", The MIT Press, 1986, pp. 318–319.

T. Kailath, "Linear Systems", p. 649, 1980.

L.B. Jackson, "Digital Filters and Signal Processing", p. 146, 1986.

Jean–Francois Cardoso, "Super–Symmetric Decomposition of the Fourth–Order Cumulant Tensor, Blind Identification of More Sources than Sensors", IEEE 1991, pp. 3109–3112.

Jean–Francois Cardoso, "Source Separation Using Higher Order Moments", IEEE 1989, pp. 2109–2112.

B. Widrow, "Adaptive Filters", in Aspects of Network and System Theory, R.E. Kalman & N. DeClaris, N.Y. 1970, pp. 563–587.

D.M. Etter, D.C. Dayton, "Performance Characteristics of a Genetic Algorithm in Adaptive IIR Filter Design", Signal Processing II: Theories & Applications (1983), pp. 53–56.

R. Roy, et al. "ESPRIT–Estimation of Signal Parameters Via Rotational Invariance Techniques", IEEE Transaction of Acoustics, Speech & Signal Processing, vol. 37, No. 7, Jul. 1989., pp. 984–995.

O.L. Frost, III, "An Algorithm for Linearly Constrained Adaptive Array Processing", Proc. of the IEEE, vol. 60, No. 8, Aug. 1972, pp. 926–935.

R. Roy, et al. "ESPRIT–Estimation of Signal Parameters via Rotational Invariance Techniques", Optical Engineering, Apr. 1990, pp. 296–313.

D. Van Compernolle, "Adaptive Filter Structures for Enhancing Cocktail Party Speech from Multiple Microphone Recordings", 1989.

International Search Report in foreign counterpart application (1 page).

Ng, S.C., et al., "Fast Convergent Genetic Search for Adaptive IIR Filtering", IEEE, 1994, vol. 6, pp. III 105–III 108.

ADAPTIVE FILTER FOR SIGNAL PROCESSING AND METHOD THEREFOR

This application is submitted with a microfiche appendix, containing copyrighted material, Copyright 1994, Interval Research Corporation. The Appendix consists of one (1) microfiche with forty-six (46) frames. The copyright owner has no objection to the facsimile reproduction by anyone of the patent document or the patent disclosure, as it appears in the Patent and Trademark Office patent file or records, but otherwise reserves all copyright rights whatsoever in the appendices.

TECHNICAL FIELD

This invention relates to the field of adaptive filter signal processing, and more particularly to an adaptive filter signal processor for use in a two stage microphone-array signal processor for separating sounds acoustically mixed in the presence of echoes and reverberations. More particularly, the present invention relates to an improved Direction of Arrival Estimator that estimates the optimal delay values for use in the direct signal separator, i.e., the first stage in the two-stage signal processor.

BACKGROUND OF THE INVENTION

It is well known that a human being can focus attention on a single source of sound even in an environment that contains many such sources. This phenomenon is often called the "cocktail-party effect."

Considerable effort has been devoted in the prior art to solve the cocktail-party effect, both in physical devices and in computational simulations of such devices. In a co-pending application we have disclosed a two stage microphone-array signal processor in which a first stage partially accomplishes the intended aim using information about the physical directions from which signals are arriving. However, that application discloses the use of a conventional direction of arrival estimator to estimate the various delays in the acoustic waves, used in the first stage to produce the signals. This application discloses an improved direction-of-arrival estimator.

Estimation of signal parameters is pivotal in such a processor as well as a variety of signal-processing applications, such as source separation and source localization. Examples of signal parameters are the differences in propagation delays from a given source to the various sensors, and the direction from which a given source signal is arriving.

One prior art solution to the problem of signal-parameter estimation is to use directional sensors: either a collection of such sensors can be mounted so as to tessellate the set of directions of interest, or a single such sensor can be used to scan the possible directions. In either case, the strategy is to identify directions from which maximum signal power is detected.

Another prior art is to scan with a directional sensor employing classical beamforming. Signals from a collection of sensors at different spatial locations are averaged together, after being subjected to relative delays and subsequent addition such that waves arriving from a particular "look direction" are enhanced relative to waves arriving from other directions. Thus, the beamformer behaves as a directional sensor whose direction of maximum sensitivity can be changed without physically reconfiguring the sensors. Flanagan et al. (1985) described a system in which speakers in an auditorium are located by a beamformer that continuously scans the auditorium floor.

There are at least two fundamental shortcomings of this approach. First, the rate at which a new source can be located and tracked is limited by the rate at which the space of possible directions can be swept; that rate depends, in turn, on the length of time required to obtain a reasonably accurate estimate of the signal power being received from a particular direction. Second, resolution is fundamentally limited since the signal averaging done by a classical beamformer cannot provide relative attenuation of frequency components whose wavelengths are larger than the array. For example, a microphone array one foot wide cannot attenuate frequency components in a sound that are below approximately 1 kHz.

Other prior art to increase the speed of source localization is achieved by a strategy that involves, in essence, shifting signals from two or more sensors in time to achieve a best match. A simple version of this principle is applied in a commercial device called the Direction Finding Blast Gauge (DFBG), developed by G. Edwards of GD Associates (1994). Designed to determine the direction from which short explosive sounds arrive, the DFBG records the times at which a shock wave traverses four symmetrically placed pressure sensors. Direction of arrival is calculated from these times in conventional manner. The DFBG is designed for short explosive sounds that are relatively isolated.

The same principle used in the DFBG has been applied in a more refined way to other types of sound. Coker and Fischell (1986) patented a system that localizes signals from speech, which consists approximately of a train of energy bursts. Sugie et al. (1988), Kaneda (1993), and Bhadkamkar and Fowler (1993) implemented systems that exploit the tendency of naturally occurring sounds to have fairly well-defined onsets: associated with each microphone is a detector that produces a spike whenever an onset occurs. All of the systems mentioned in this paragraph operate by finding inter-microphone time delays that maximize the rate at which coincident spikes are detected. They compensate for noise in the individual time-delay estimates by generating joint estimates from multiple measurements. When many sources of sound are present, these statistical estimates are derived by histogram methods. Thus, the accuracy of the method depends on an assumption that over the time scale on which the individual time-delay estimates are made, the spike trains come predominantly from one source.

In a similar vein, noisy time-delay estimates can be obtained from narrowband signals by comparing their complex phases, provided that the magnitudes of the delays are known in advance not to exceed the period of the center frequency. Joint estimates can be produced, as above, by histogram methods. The front end of a system described by Morita (1991) employs a scheme of this type.

The approaches to sound localization employed by Edwards (1994), by Coker and Fischell (1986), by Sugie et al. (1988), by Kaneda (1993), by Bhadkamkar and Fowler (1993) and by Morita (1991) accommodate multiple sources by exploiting an assumption that in most time intervals over which individual time-delay estimates are made, signal from only one source is present.

The techniques to which we now turn our attention, like the present invention, differ from these in two ways. First, they do not rely on the assumption that at most one source is present per measurement interval. Second, they are designed for a more general domain of signal-parameter estimation, in which time-delay estimation is only one example.

The so-called "signal-subspace" techniques, as exemplified by ESPRIT (Roy et al., 1988) and its predecessor, MUSIC (Schmidt, 1981), are specific for narrowband signals. The collection of n sensor signals is treated as a 2n-dimensional vector that varies in time. From prior knowledge of the array configuration, it is known what dimensions of this 2n-dimensional signal space would be accessible to the signal vector arising from a single source, as a function of the desired signal parameters. Moreover, by diagonalizing the covariance matrix of the observed signal vector and by inspecting the resulting eigenvalues and eigenvectors, it is known what dimensions of the signal space are actually spanned by the signal vector. Estimates for the desired signal parameters are extracted by comparing these two pieces of information. This prior art requires the source signals not be fully correlated; otherwise, the observed covariance matrix contains insufficient information to extract the signal parameters.

The shortcomings of this prior art relative to the present invention are (a) that it is computationally intensive; (b) that the sensor-array configuration must be partially known; and (c) that the number of sensors far exceed the number of sources (otherwise, the signal vector can span all available dimensions).

Another prior art is based on an assumption that source signals are statistically independent. The condition of statistical independence is much more stringent than that of decorrelation: whereas two signals x(t) and y(t) are decorrelated if $E\{[x(t)y(t)]\}=E\{x(t)\}E\{y(t)\}$, they are statistically independent only if $E\{f[x(t)]g[y(t)]\}=E\{f[x(t)]\}E\{g[y(t)]\}$ for any scalar functions f and g. (The notation $E\{\bullet\}$ denotes an estimate of the expected value of the enclosed expression, as computed by a time average.) In return for requiring the more stringent conditions on the nature of the source signals, statistical-independence techniques do not always require prior knowledge of the array configuration. (For example, if the signal parameters to be estimated are the relative propagation delays from the sources to the sensors, nothing need be known about the array geometry; however, inter-sensor distances are obviously needed if the relative time delays are to be translated into physical directions of arrival.)

Moreover, these techniques accomplish the more difficult goal of source separation, i.e., recovery of the original source signals from the observed mixtures; signal-parameter estimation is normally a by-product.

Like signal-subspace techniques, some statistical-independence techniques begin by diagonalizing the covariance matrix because doing so decorrelates the components of the signal vector. However, they are distinct because they use the results of diagonalization in different ways. Critical to understanding the distinction is that neither parameter estimation nor source separation can be achieved merely by diagonalizing the covariance matrix (Cardoso, 1989; Lacoume and Ruiz, 1992; Moulines and Cardoso, 1992). Whereas the signal-subspace techniques fill in the missing information by employing knowledge of the sensor-array configuration, the statistical-independence techniques do so by applying additional conditions based on the sensor-signal statistics alone.

Statistical-independence techniques can be summarized as follows. The source signals are treated as a signal vector, as are the sensor signals. The processes by which the source signals propagate to the sensors are modeled as a transformation H from the source signal vector to the sensor signal vector. This transformation can consist of a combination of additions, multiplications, time delays, and convolutive filters. If the transformation H were known, then its inverse (or pseudoinverse) could be computed, and applied to the sensor signal vector to recover the original sources. However, since the source locations relative to the sensor array are not known, the inverse transformation must be estimated. This is done by finding a transformation S that, when applied to the sensor signal vector, produces an output signal vector whose components are statistically independent. Statistical-independence techniques are relevant in the present context inasmuch as signal parameters can often be estimated from S.

Most existing statistical-independence techniques that are adaptive, i.e., able to alter S in response to changes in the mixing transformation H, operates by maintaining a single estimate of S. As new data from the signal stream become available, they are incorporated by updating the estimate of S. These are referred to as "single-estimate" techniques because memory of past data is contained, at any given instant, in a single estimate of S.

The chief goal of this invention is to remove a dilemma, common to single-estimate techniques, that arises from the presence of two opposing factors in the selection of time constants for adaptation. On one hand, the mixing transformation H can undergo large, abrupt, sporadic changes; the abruptness of these changes calls for short time constants so that the system can adapt quickly. On the other hand, the source signals can be such that they are statistically independent only over relatively long time scales: when averaging is performed over shorter time scales, statistical error and coincidental correlation imply deviations from true statistical independence. To obtain accurate estimates of S from such data, it would seem necessary to employ long time scales.

Previous adaptive techniques for parameter estimation based on statistical independence are now reviewed. In each case it is shown why the given technique can be considered a single-estimate procedure.

In one class of single-estimate techniques, the following steps are executed periodically. Joint statistics of the signal vector are averaged over a set of times defined relative to the current time, with inverse time constant β. A value of S, called S', is chosen such that it enforces certain conditions of statistical independence exactly over the averaging time. The estimate of S used to generate the separated outputs of the system may be S' itself, but more commonly it is a smoothed version of S', with smoothing parameter µ. A well-known technique in this class is Fourth Order Blind Identification (FOBI), in which S' is computed by simultaneously diagonalizing the covariance and quadricovariance matrices, thus satisfying conditions of the form $E\{x(t)y(t)\}=0$ and $E\{x^3(t)y(t)+x(t)y^3(t)\}=0$ (Cardoso, 1989; Lacoume and Ruiz, 1992). Since x(t) and y(t) are assumed to have zero mean, the two equations are necessary conditions for statistical independence.

Another class of techniques, whose genesis is attributed to Herault and Jutten (1986), is closely related to the LMS algorithm (Widrow, 1970). S is taken to be a matrix of simple gains; thus, it is assumed that each source signal arrives at every microphone simultaneously. The quantity ΔS is computed at every time step, based on the instantaneous value of the output vector, y=Sx:

$$\Delta S = f[y_i(t)]g[y_j(t)],$$

where f and g are different odd nonlinear functions.

The estimate S is updated at every time step, according to the rule $S(\text{new})=S(\text{old})+\mu\Delta S$. We will refer to the use of rules of this type as "weight-update" techniques. This technique works because when the components of the output-signal vector x are statistically independent, the statistical relation $E\{f[x_i(t)]g[x_j(t)]\}=E\{f[x_i(t)]\}E\{g[x_j(t)]\}$ holds for any different i and j. Since the signals have zero mean and f and g are odd, $E\{f[x_i(t)]g[x_j(t)]\}=0$. Consequently, $E\{\Delta S\}=0$; thus, the transformation S fluctuates about a fixed point. (If f and g were both linear, then the Herault-Jutten technique would only decorrelate the outputs; and decorrelation is insufficient for statistical independence.)

A host of other weight-update techniques have been derived from Herault and Jutten (1986). Some variants employ a different criterion for separation in which $y_i(t)$ is decorrelated with $y_j(t-T_1)$ and with $y_j(t-T_2)$, where $T_1$ and $T_2$ are different time delays, determined in advance (Tong et al., 1991; Abed-Meraim et al., 1994; Van Gerven and Van Compernolle, 1994; Molgedey and Schuster, 1994). Other variants of Herault-Jutten employ a transformation S whose elements are time delays (Platt and Faggin, 1992; Bar-Ness, 1993) or convolutive filters (Jutten et al., 1992; Van Compernolle and Van Gerven, 1992). By going beyond the simple gains employed by Herault and Jutten, these techniques come closer to separating signals that have been mixed in the presence of propagation delay and echoes. Certain difficulties in adaptation associated with the use of convolutive filters are addressed by a recent class of two-stage structures (Dinç and Bar-Ness, 1993; Najar et al., 1994) in which a second weight-update stage is placed before or after the first, to improve the quality of separation attained after convergence.

Single-estimate techniques for adaptive source separation all suffer to some extent from the dilemma described above: that the rate of adaptation cannot be increased without simultaneously increasing the size of fluctuations present even after convergence is reached. In some practical applications, there exist settings of μ for which both the rate of adaptation and the size of the fluctuations are acceptable; in others, there is a pressing need for techniques in which adaptation and fluctuation are not intrinsically co-dependent.

To accomplish this end, the present invention is founded in a break from the tradition of maintaining a single estimate of S and incorporating new data by changing the value of S. Rather, multiple estimates of S, called hypotheses, are maintained. Associated with each hypothesis is a number called the cumulative performance value. In contrast with single-estimate techniques, which incorporate new data by perturbing the estimate of S, the present technique incorporates new data by perturbing the cumulative performance values. Thus, each hypothesis remains unchanged from the time it is created to the time that it is destroyed. At any given instant, the hypothesis of greatest cumulative performance value is taken to be the correct one. Optionally, smoothing may be employed to avoid discontinuous changes in S; however, this smoothing is not an intrinsic part of the adaptive process.

Until this point we have discussed related art for achieving sound separation, which is one particular application of adaptive filtering. However, the present invention is contemplated to have potential uses in other applications of adaptive filtering. We now therefore turn our attention to related art in the broader field of adaptive filtering. Compared to any given variant of the standard techniques, the present invention is superior in at least one of the following ways:

There is essentially no restriction on the form of the performance function, although from a practical standpoint certain performance functions can be computationally intensive to handle.

Once convergence is achieved, it does not necessarily exhibit fluctuations in proportion to the rate of adaptation.

It does not necessarily fail when the performance function is underdetermined.

These attractive properties of the present invention will be explained in the context of the standard techniques.

We first describe stochastic-gradient (SG) techniques and explain the shortcoming of SG techniques that the present invention is intended to avoid. We describe how least squares (LS) techniques overcome this limitation, and state why LS techniques cannot always be used. We identify a source of difficulty in adaptive filtering that we call instantaneous underdetermination, and explain why the present invention is superior to SG and LS with respect to its handling of instantaneous underdetermination.

We then turn discuss a less standard, but published technique based on the genetic algorithm (GA). We state why the GA might be considered prior art, then differentiate the present invention from it.

Problems in adaptive filtering can generally be described as follows. One or more time-varying input signals $x_i(t)$ are fed into a filter structure H with adjustable coefficients $h_k$, i.e., $H=H(h_1,h_2,\ldots)$. Output signals $y_i(t)$ emerge from the filter structure. For example, an adaptive filter with one input $x(t)$ and one output $y(t)$ in which H is a linear, causal FIR might take the form:

$$y(t) = \sum_{k=0}^{N} h_k x(t - k\Delta t).$$

In general, H might be a much more complicated filter structure with feedback, cascades, parallel elements, non-linear operations, and so forth.

The object is to adjust the unknowns $h_k$ such that a performance function $C(t)$ is maximized over time. The performance function is usually a function of statistics computed over recent values of the outputs $y_i(t)$; but in general, it may also depend on the input signals, the filter coefficients, or other quantities such as parameter settings supplied exogenously by a human user.

The most basic SG technique, Least Mean Square (LMS), can be used for instances of this problem in which the gradient of the performance function $C(t)$ with respect to the filter coefficients $h_i(t)$ can be expressed as a time average of some quantities $G_i(t)$. The Herault-Jutten algorithm for sound separation, described previously, may be regarded as an example of LMS.

For example, consider the transmission-line echo-cancellation problem typical in the design of full-duplex modems:

$$y(t) = x_1(t) + \sum_k h_k x_2(t - k\Delta t)$$

$$C(t) = E[y^2(t)].$$

Differentiating C with respect to the filter coefficients $h_i$, we have:

$$(\partial/\partial h_i)C = E[2y(t)x_2(t-i\Delta t)] = E[G_i],$$

where $$G_i(t) = 2y(t)x_2(t-i\Delta t).$$

The LMS algorithm calls for updating the coefficients $h_i$ as follows:

$$h_i(\text{new}) = h_i(\text{old}) + \mu G_i(t),$$

where μ is a stepsize that is chosen in advance. It may be seen that when the coefficients $h_i$ are near a local maximum of C, i.e., the gradient of C is zero and the Hessian matrix of C is negative definite, then $E[G_i]=0$ and the coefficients fluctuate about that maximum.

Thus, unlike the present invention, SG techniques require that the performance function be differentiable, and that the gradient be numerically easy to compute.

In addition, SG techniques suffer from a key problem: for any nonzero stepsize $\mu$, the coefficients fluctuate. Stated more generally, two important performance criteria—the rate of adaptation and the steady-state error in the outputs—are at odds with each other in the setting of $\mu$. Numerous solutions to this dilemma have been proposed:

In block-based variants of LMS, updates to the filter coefficients are accumulated over blocks of time and added to the coefficients at the end of each block, instead of being added at every time step.

In adaptive-stepsize LMS, the quantity $\mu$ is adjusted according to a predefined schedule ("gearshifting") or is itself adapted as a parameter of the system using an algorithm similar to LMS ("gradient adaptive step size").

These incremental modifications to the LMS algorithm mitigate, but do not eliminate the problem of fluctuation. This problem cannot be eliminated fully without abandoning the principle of operation behind LMS and its variants: that only the time-averaged fluctuation $E[\mu G_i]$ (not the individual update, $\mu G_i$) is zero when the filter is fully adapted.

The stochastic fluctuations just described are absent in the so-called Least Squares (LS) techniques, of which Recursive Least Squares (RLS) is the archetype. The operations performed by RLS are mathematically equivalent to maximize C(t) exactly at every time step; thus, in RLS, the computed filter coefficients converge asymptotically to their correct values as fast as the statistics estimated in the computation of C(t) converge.

Maximizing C(t) exactly at every step would be computationally prohibitive if done by brute force at every time step, because C(t) is a functional that depends on integrals of the data from the beginning of time. In RLS, a practical level of efficiency is achieved by a mathematical trick that permits the exact maximum of C(t) for the current time step to be computed from the exact maximum computed at a previous time step and the intervening data.

An LS technique is often the method of choice when a problem can be formulated appropriately. However, because of reliance on "mathematical tricks" to maximize C(t) exactly and efficiently at every time step, LS techniques have been developed only for certain restricted classes of adaptive-filtering problems:

H is a FIR filter and $$C(t) = \sum_{k=0}^{n} a(n) b[y(t - n\Delta t) - d(t - n\Delta t)]$$

where d(t) is a desired signal, a(●) is one of a handful of averaging functionals that can be computed recursively, and b[●] is typically ●²;

H is a lattice filter and C(t) is as above;

H is a filter with a systolic architecture and C(t) is as above;

H is an IIR filter and C(t) is in "equation-error" form.

In contrast, the present invention requires neither a closed-form solution for the maximum of C(t) nor an efficient update scheme for computing the current maximum of C(t) from a past maximum and the intervening data. Thus, the present invention may be considered an alternative to LS and the SG methods for situations in which the latter do not work well enough and the former do not exist.

In addition to the comparisons made so far, differences between LS, SG, and this invention arise in the handling of instantaneous underdetermination. For the present purposes, we use the term "instantaneously underdetermined" to describe a performance function for which global maximization at any particular instant does not necessarily produce the desired filter coefficients-the "correct" filter coefficients might not be the only ones that produce a maximal or numerically near-maximal value of the performance function. Such degeneracy can occur when the locus of global maximal of the performance function is delocalized, or when the basin of attraction is of sufficiently low curvature in one or more dimensions that noise and numerical imprecision can cause the apparent maximum to move far from the ideal location. When a performance function is instantaneously underdetermined, snapshots of the performance surface from many different instants in time may together contain enough information to determine a solution.

LS methods operate by attempting to find the maximum of C(t) at every instant in time, effectively by solving a system of linear equations. Underdetermination is manifested as ill-conditioning or rank deficiency of the coefficient matrix. The solution returned by such an ill-conditioned system of linear equations is very sensitive to noise.

The behavior of SG methods and of the present invention with respect to instantaneous underdetermination is more difficult to analyze since both systems involve the accumulation of small changes over time. To simplify the comparison, note that the present invention can use a standard SG technique or any other method for adaptive filtering as a source of guesses at the correct filter coefficients. Thus, such a combination can always find the correct (or nearly correct) filter coefficients if the SG technique alone can find them. The two methods differ in what happens after such coefficients are found. In the case of SG, fluctuations can eventually cause the coefficients $h^i(t)$ to drive far from their correct values because with instantaneous underdetermination, the update vectors mu $G_i(t)$ can point away from the correct values (Cohen, 1991). In the case combining SG with the present invention, if a set of correct filter coefficients ever appears in the population of candidate parameter sets, the invention as a whole will use those coefficients without fluctuation.

We turn our attention in the remainder of this section to published work in adaptive filtering based on the genetic algorithm (GA):

R. Nambiar, C. K. K. Tang, and P. Mars, "Genetic and Learning Automata Algorithms for Adaptive Digital Filters," ICASSP '92, IV:41-44 (1992).

S. J. Flockton and M. S. White, "Pole-Zero System Identification Using Genetic Algorithms," Fifth International Conference on Genetic Algorithms, 531-535 (1993).

S. C. Ng, C. Y. Chung, S. H. Leung, and Andrew Luk, "Fast Convergent Search for Adaptive IIR Filtering," ICASSP '94, 111:1 05-108 (1994).

These applications of the GA to adaptive filtering are similar in form to the present invention because the GA employs a population of candidate solutions.

The works of Calloway (1991), Etter and Dayton (1983), Etter et al. (1982), Eisenhammer et al. (1993), Flockton and White (1993), Michielssen et al. (1992), Suckley (1992), and Xu and Daley (1992) are the easiest to eliminate from consideration as prior art because the problems under consideration did not require adaptation: the object was to adjust unknown filter coefficients such that the frozen performance function C(t) is maximized at a single instant in time. Thus the design of these GAs does not take into account any of the difficulties associated with maximizing a time-varying performance function consistently over time.

The remaining known applications of the GA to signal processing are examples of adaptive filtering in the sense that they do accommodate time variation of the performance function. These are Nambiar et al. (1992), Nambiar and Mars (1992), Ng et al. (1994), Patiakin (1993), and Stearns et al. (1982). In every case, however, the only way that time variation is taken into account is via what might be called the "headstart" principle. Rather than attempt to find the optimum of C(t) independently for every time t, these methods use the population of solutions from a time in the recent past as an initial guess at the solution for the current time. In some cases, rounds of gradient descent are interleaved with short runs of the GA, but the principle is the same. All of these GAs operate with the goal of finding the global optimum of C(t) for every time t.

These GAs do not solve the fundamental problem that a snapshot of the performance function at any given time contains noise. When the performance function fluctuates, so do the optimized filter parameters. One way to make each snapshot more reliable, and therefore make the optimized filter parameters fluctuate less, is to lengthen the time windows of the averages used to compute the performance function. Another way is to smooth the optimized filter parameters in time. Both approaches make the system slow to react to changes. Moreover, the fluctuations and sensitivity to noise mentioned in this paragraph are exacerbated if the performance function is underdetermined.

It is desirable to develop a method for adaptive filtering that applies even when the performance function cannot be maximized analytically or differentiated, that does not exhibit fluctuations in proportion to the rate of adaptation, and that copes well with noise and underdetermination.

SUMMARY OF THE INVENTION

The present invention is a method and an apparatus for determining a set of a plurality of parameter values for use in an adaptive filter signal processor to process a plurality of signals to generate a plurality of processed signals.

The method stores a plurality of the sets, called a population. The population is initially generated at random. Each set is evaluated according to an instantaneous performance value. The instantaneous performance value of each set is added, at each clock cycle, to a cumulative performance value. At any given time, the set with the greatest cumulative performance value is used in the adaptive filter signal processor.

Periodically, a new parameter set is generated at random for possible incorporation into the population. If the instantaneous performance value of the new parameter set exceeds the least instantaneous performance value in the population, it is incorporated into the population. The set with the least cumulative performance value is deleted from the population, and the new parameter set is assigned an initial cumulative performance value that falls short of the greatest cumulative performance value by a fixed amount.

DETAILED DESCRIPTION OF THE INVENTION

The present invention is an embodiment of a direction of arrival estimator portion of an adaptive filter signal processor, and the adaptive filter signal processor, which may be used in a device that mimics the cocktail-party effect using a plurality of microphones with as many output audio channels, and a signal-processing module. When situated in a complicated acoustic environment that contains multiple audio sources with arbitrary spectral characteristics, the processor as a whole supplies output audio signals, each of which contains sound from at most one of the original sources. These separated audio signals can be used in a variety of applications, such as hearing aids or voice-activated devices.

Figure 1:
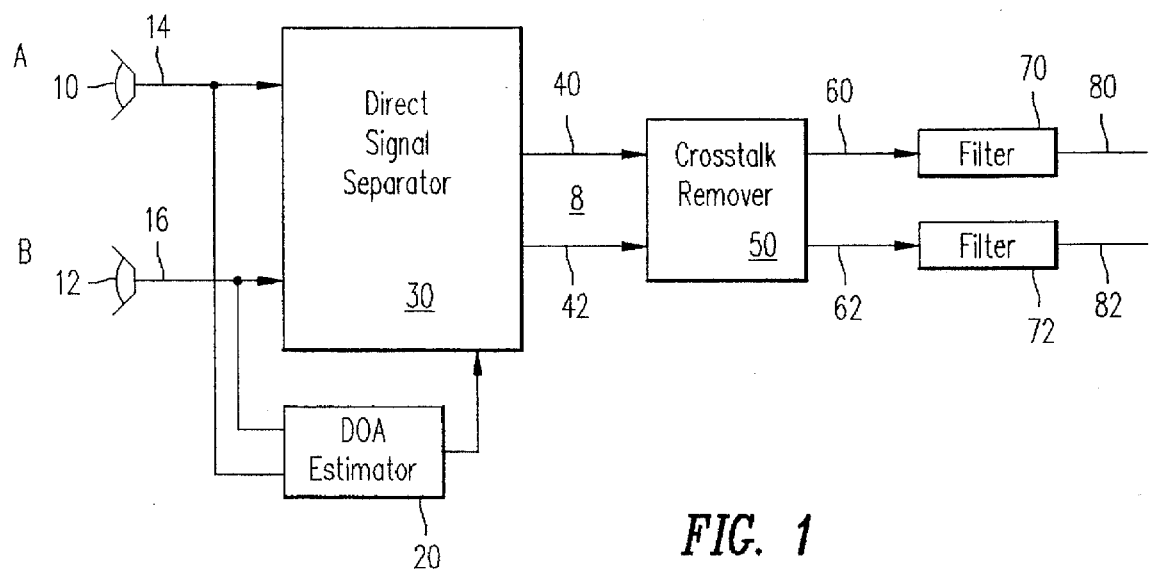
FIG. 1 is a schematic block diagram of an embodiment of an acoustic signal processor, using two microphones, with which the adaptive filter signal processor of the present invention may be used.

FIG. 1 is a schematic diagram of a signal separator processor of one embodiment of the present invention. As previously discussed, the signal separator processor of the present invention can be used with any number of microphones. In the embodiment shown in FIG. 1, the signal separator processor receives signals from a first microphone 10 and a second microphone 12, spaced apart by about two centimeters. As used herein, the microphones 10 and 12 include transducers (not shown), their associated preamplifiers (not shown), and A/D converters 22 and 24 (shown in FIG. 2).

The microphones 10 and 12 in the preferred embodiment are omnidirectional microphones, each of which is capable of receiving acoustic wave signals from the environment and for generating a first and a second acoustic electrical signal 14 and 16 respectively. The microphones 10 and 12 are either selected or calibrated to have matching sensitivity. The use of matched omnidirectional microphones 10 and 12, instead of directional or other microphones leads to simplicity in the direct-signal separator 30, described below. In the preferred embodiment, two Knowles EM-3046 omnidirectional microphones were used, with a separation of 2 centimeters. The pair was mounted at least 25 centimeters from any large surface in order to preserve the omnidirectional nature of the microphones. Matching was achieved by connecting the two microphone outputs to a stereo microphone preamplifier and adjusting the individual channel gains so that the preamplifier outputs were closely matched. The preamplifier outputs were each digitally sampled at 22,050 samples per second, simultaneously. These sampled electrical signals 14 and 16 are supplied to the direct signal separator 30 and to a Direction of Arrival (DOA) estimator 20.

The direct-signal separator 30 employs information from a DOA estimator 20, which derives its estimate from the microphone signals. In a different embodiment of the invention, DOA information could come from an source other than the microphone signals, such as direct input from a user via an input device.

The direct signal separator 30 generates a plurality of output signals 40 and 42. The direct signal separator 30 generates as many output signals 40 and 42 as there are microphones 10 and 12, generating as many input signals 14 and 16 as are supplied to the direct signal separator 30. Assuming that there are two sources, A and B, generating acoustic wave signals in the environment in which the signal processor 8 is located, then each of the microphones 10 and 12 would detect acoustic waves from both sources. Hence, each of the electrical signals 14 and 16, generated by the microphones 10 and 12, respectively, contains components of sound from sources A and B.

The direct-signal separator 30 processes the signals 14 and 16 to generate the signals 40 and 42 respectively, such that in anechoic conditions (i.e., the absence of echoes and reverberations), each of the signals 40 and 42 would be of an electrical signal representation of sound from only one source. In the absence of echoes and reverberations, the electrical signal 40 would be of sound only from source A, with electrical signal 42 being of sound only from source B, or vice versa. Thus, under anechoic conditions the direct-signal separator 30 can bring about full separation of the sounds represented in signals 14 and 16. However, when echoes and reverberation are present, the separation is only partial.

The output signals 40 and 42 of the direct signal separator 30 are supplied to the crosstalk remover 50. The crosstalk remover 50 removes the crosstalk between the signals 40 and 42 to bring about fully separated signals 60 and 62 respectively. Thus, the direct-signal separator 30 and the crosstalk remover 50 play complementary roles in the system 8. The direct-signal separator 30 is able to bring about full separation of signals mixed in the absence of echoes and reverberation, but produces only partial separation when echoes and reverberation are present. The crosstalk remover 50 when used alone is often able to bring about full separation of sources mixed in the presence of echoes and reverberation, but is most effective when given inputs 40 and 42 that are partially separated.

After some adaptation time, each output 60 and 62 of the crosstalk remover 50 contains the signal from only one sound source: A or B. Optionally, these outputs 60 and 62 can be connected individually to post filters 70 and 72, respectively, to remove known frequency coloration produced by the direct signal separator 30 or the crosstalk remover 50. Practitioners skilled in the art will recognize that there are many ways to remove this known frequency coloration; these vary in terms of their cost and effectiveness. An inexpensive post filtering method, for example, consists of reducing the treble and boosting the base.

The filters 70 and 72 generate output signals 80 and 82, respectively, which can be used in a variety of applications. For example, they may be connected to a switch box and then to a hearing aid.

Figure 2:
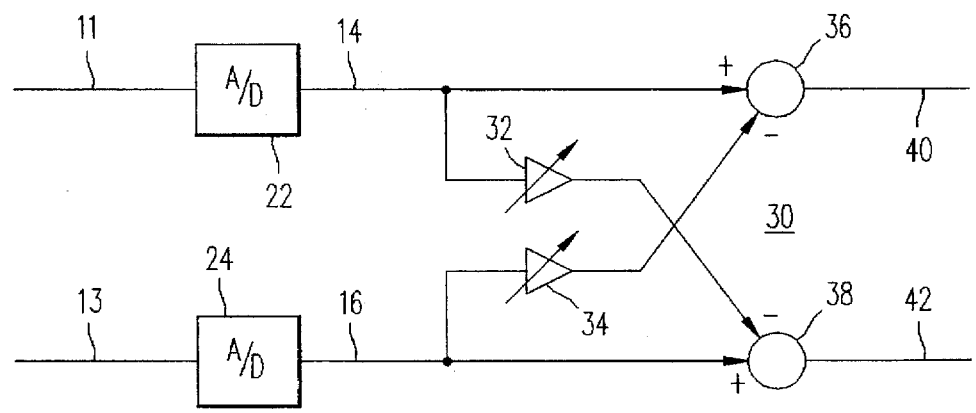
FIG. 2 is a schematic block diagram of an embodiment of the direct-signal separator portion, i.e., the first stage of the processor shown in FIG. 1.

Referring to FIG. 2 there is shown one embodiment of the direct signal separator 30 portion of the signal processor 8 of the present invention. The microphone transducers generate input signals 11 and 13, which are sampled and digitized, by clocked sample-and-hold circuits followed by analog-to-digital converters 22 and 24, respectively, to produce sampled digital signals 14 and 16 respectively.

The digital signal 14 is supplied to a first delay line 32. In the preferred embodiment, the delay line 32 delays the digitally sampled signal 14 by a non-integral multiple of the sampling interval T, which was 45.35 microseconds given the sampling rate of 22,050 samples per second. The integral portion of the delay was implemented using a digital delay line, while the remaining subsample delay of less than one sample interval was implemented using a non-causal, truncated sinc filter with 41 coefficients. Specifically, to implement a subsample delay of t, given that t<T, the following filter is used:

$$y(n) = \sum_{k=-20}^{20} w(k)x(n-k)$$

where x(n) is the signal to be delayed, y(n) is the delayed signal, and w(k) {k=−20,−19, . . . 19,20} are the 41 filter coefficients. The filter coefficients are determined from the subsample delay t as follows:

$$w(k) = (1/S) \operatorname{sinc}\{\pi\, [(t/T) - k]\}$$
where $$\operatorname{sinc}(a) = \sin(a)/a \quad \text{if } a \text{ not equal to 0}$$
$$= 1 \quad \text{otherwise,}$$

and S is a normalization factor given by $$S = \sum_{k=-20}^{20} \operatorname{sinc}\{\pi\, [(t/T) - k]\}.$$

The output of the first delay line 32 is supplied to the negative input of a second combiner 38. The first digital signal 14 is also supplied to the positive input of a first combiner 36. Similarly, for the other channel, the second digital signal 16 is supplied to a second delay line 34, which generates a signal which is supplied to the negative input of the first combiner 36.

In the preferred embodiment, the sample-and-hold and A/D operations were implemented by the audio input circuits of a Silicon Graphics Indy workstation, and the delay lines and combiners were implemented in software running on the same machine.

However, other delay lines such as analog delay lines, surface acoustic wave delays, digital low-pass filters, or digital delay lines with higher sampling rates, may be used in place of the digital delay line 32, and 34. Similarly, other combiners, such as analog voltage subtractors using operational amplifiers, or special purpose digital hardware, may be used in place of the combiners 36 and 38.

Figure 6:
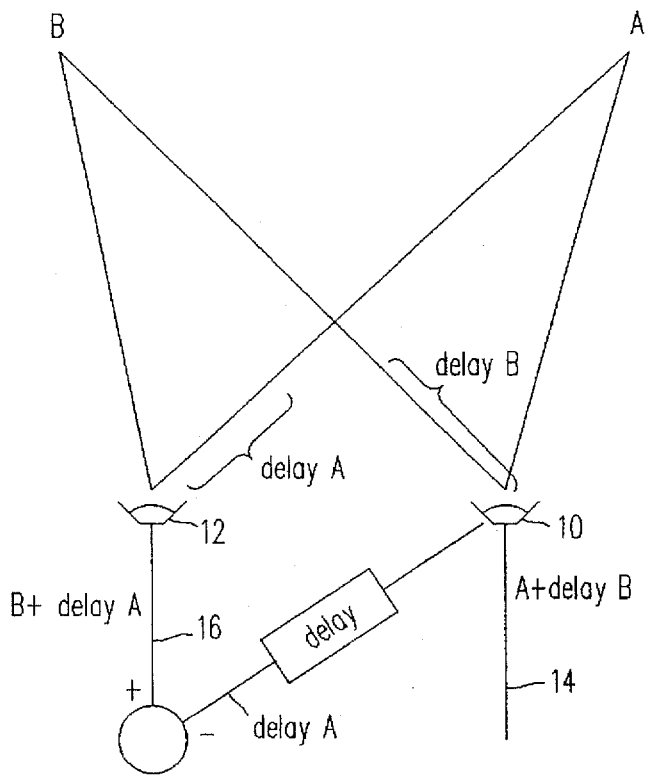
FIG. 6 is an overview of the delay in the acoustic waves arriving at the direct signal separator portion of the signal processor of FIG. 1, and showing the separation of the signals.

Schematically, the function of the direct signal separator 30 may be seen by referring to FIG. 6. Assuming that there are no echoes or reverberations, the acoustic wave signal received by the microphone 12 is the sum of source B and a delayed copy of source A. (For clarity in presentation here and in the forthcoming theory section, time relationship between the sources A and B and the microphones 10 and 12 are described as if the electrical signal 14 generated by the microphone 10 were simultaneous with source A and the electrical signal 16 generated by the microphone 12 were simultaneous with source B. This determines the two-arbitrary additive time constants that one is free to choose in each channel.) Thus, the electrical signal 16 generated by the microphone 12 is an electrical representation of the sound source B plus a delayed copy of source A. Similarly, the electrical signal 14 generated by the microphone 10 is an electrical representation of the sound source A and a delayed copy of sound source B. By delaying the electrical signal 14 an appropriate amount, the electrical signal supplied to the negative input of the combiner 38 would represent a delayed copy of source A plus a further delayed copy of source B. The subtraction of the signal from the delay line 32 and digital signal 16 would remove the signal component representing the delayed copy of sound source A, leaving only the pure sound B (along with the further delayed copy of B).

The amount of delay to be set for each of the digital delay lines 32 and 34 can be supplied from the DOA estimator 20. Numerous methods for estimating the relative time delays have been described in the prior art (for example, Schmidt, 1981; Roy et al., 1988; Morita, 1991; Allen, 1991). Thus, the DOA estimator 20 is well known in the art.

In a different embodiment, omni-directional microphones 10 and 12 could be replaced by directional microphones placed very close together. Then all delays would be replaced by multipliers; in particular, digital delay lines 32 and 34 would be replaced by multipliers. Each multiplier would receive the signal from its respective A/D converter and generate a scaled signal, which can be either positive or negative, in response.

Figure 3:
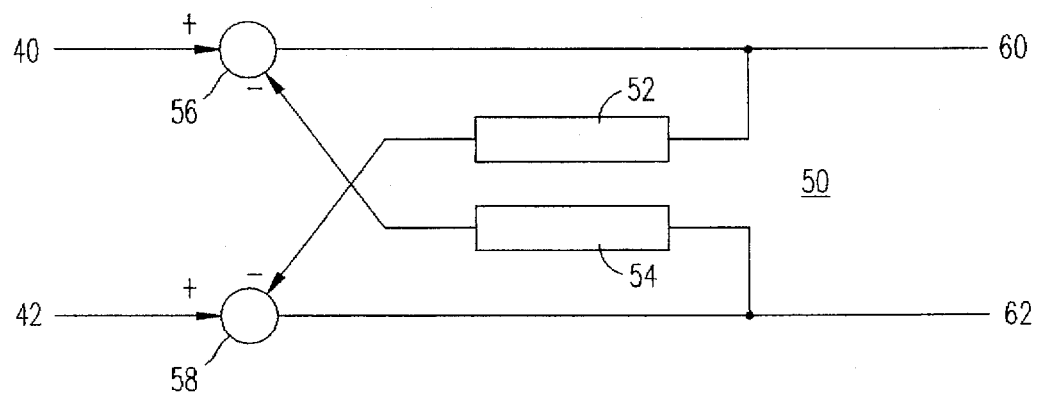
FIG. 3 is a schematic block diagram of an embodiment of the crosstalk remover portion, i.e., the second stage of the processor shown in FIG. 1.

A preferred embodiment of the crosstalk remover 50 is shown in greater detail in FIG. 3. The crosstalk remover 50 comprises a third combiner 56 for receiving the first output signal 40 from the direct signal separator 30. The third combiner 56 also receives, at its negative input, the output of a second adaptive filter 54. The output of the third combiner 56 is supplied to a first adaptive filter 52. The output of the first adaptive filter 52 is supplied to the negative input of the fourth combiner 58, to which the second output signal 42 from the direct signal separator 30 is also supplied. The outputs of the third and fourth combiners 56 and 58 respectively, are the output signals 60 and 62, respectively of the crosstalk remover 50.

Figure 7:
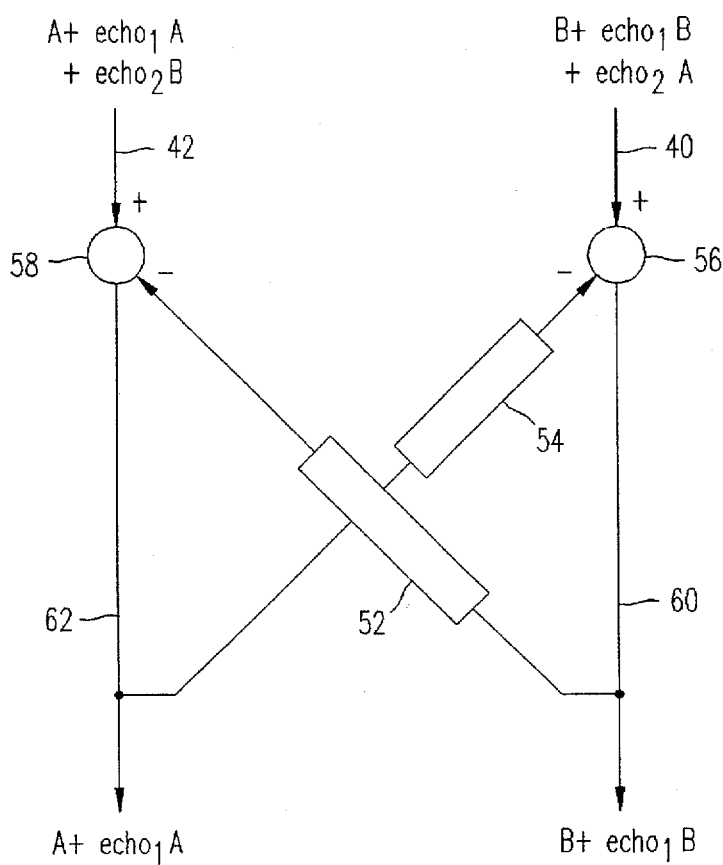
FIG. 7 is an overview of a portion of the crosstalk remover of the signal processor of FIG. 1 showing the removal of the crosstalk from one of the signal channels.

Schematically, the function of the crosstalk remover 50 may be seen by referring to FIG. 7. The inputs 40 and 42 to the crosstalk remover 50 are the outputs of the direct-signal separator 30. Let us assume that the direct-signal separator 30 has become fully adapted, i.e., (a) that the electrical signal 40 represents the acoustic wave signals of source B and its echoes and reverberation, plus echoes and reverberation of source A, and similarly (b) that the electrical signal 42 represents the acoustic wave signals of source A and its echoes and reverberation, plus echoes and reverberation of source B. Because the crosstalk remover 50 is a feedback network, it is easiest to analyze subject to the assumption that adaptive filters 52 and 54 are fully adapted, so that the electrical signals 62 and 60 already correspond to colored versions of B and A, respectively. The processing of the electrical signal 60 by the adaptive filter 52 will generate an electrical signal equal to the echoes and reverberation of source B present in the electrical signal 42; hence subtraction of the output of adaptive filter 52 from the electrical signal 42 leaves output signal 62 with signal components only from source A. Similarly, the processing of the electrical signal 62 by the adaptive filter 54 will generate an electrical signal equal to the echoes and reverberation of source A present in the electrical signal 40; hence subtraction of the output of adaptive filter 54 from the electrical signal 40 leaves output signal 60 with signal components only from source B.

Theory

It is assumed, solely for the purpose of designing the direct-signal separator 30, that the microphones 10 and 12 are omnidirectional and matched in sensitivity.

Under anechoic conditions, the signals $x_1(t)$ and $x_2(t)$, which correspond to the input signals, received by microphones 10 and 12, respectively, may be modeled as $$x_1(t) = w_1(t) + w_2(t-\tau_2)$$

$$x_2(t) = w_2(t) + w_1(t-\tau_1),$$

where $w_1(t)$ and $w_2(t)$ are the original source signals, as they reach microphones 10 and 12, respectively, and $\tau_1$ and $\tau_2$ are unknown relative time delays, each of which may be positive or negative.

Practitioners experienced in the art will recognize that bounded "negative" time delays can be achieved by adding a net time delay to the entire system.

The relative time delays $\tau_1$ and $\tau_2$ are used to form outputs $y_1(t)$ and $y_2(t)$, which correspond to signals 40 and 42:

$$y_1(t) = x_1(t) - x_2(t-\tau_2) = w_1(t) - w_1(t-(\tau_1+\tau_2))$$

$$y_2(t) = x_2(t) - x_1(t-\tau_1) = w_2(t) - w_2(t-(\tau_1+\tau_2))$$

As depicted in FIG. 2, these operations are accomplished by time-delay units 32 and 34, and combiners 36 and 38.

Under anechoic conditions, these outputs 40 and 42, would be fully separated; i.e., each output 40 or 42 would contain contributions from one source alone. However under echoic conditions these outputs 40 and 42 are not fully separated.

Under echoic and reverberant conditions, the microphone signals $x_1(t)$ and $x_2(t)$, which correspond to input signals received by the microphones 10 and 12, respectively, may be modeled as $$x_1(t) = w_1(t) + w_2(t-\tau_2) + k_{11}'(t)*w_1(t) + k_{12}'(t)*w_2(t)$$

$$x_2(t) = w_2(t) + w_1(t-\tau_1) + k_{21}'(t)*w_2(t) + k_{22}'(t)*w_2(t),$$

where the symbol "*" denotes the operation of convolution, and the impulse responses $k_{11}'(t)$, $k_{12}'(t)$, $k_{22}'(t)$, and $k_{22}'(t)$ incorporate the effects of echoes and reverberation.

Specifically, $k_{11}'(t)*w_1(t)$ represents the echoes and reverberations of source 1 ($w_1(t)$) as received at input 1 (microphone 10), $k_{12}'(t)*w_2(t)$ represents the echoes and reverberations of source 2 ($w_2(t)$) as received at input 1 (microphone 10), $k_{21}'(t)*w_1(t)$ represents the echoes and reverberations of source 1 ($w_1(t)$) as received at input 2 (microphone 12), and $k_{22}'(t)*w_2(t)$ represents the echoes and reverberations of source 2 ($w_2(t)$) as received at input 2 (microphone 12).

In consequence of the presence of echoes and reverberation, the outputs 40 and 42 from the direct-signal separator 30 are not fully separated, but instead take the form $$\begin{aligned} y_1(t) &= x_1(t) - x_2(t-\tau_2) \\ &= w_1(t) - w_1(t-(\tau_1+\tau_2)) + k_{11}(t)*w_1(t) + k_{12}(t)*w_2(t) \\ y_2(t) &= x_2(t) - x_1(t-\tau_1) \\ &= w_2(t) - w_2(t-(\tau_1+\tau_2)) + k_{21}(t)*w_1(t) + k_{22}(t)*w_2(t) \end{aligned}$$

where the filters $k_{11}(t)$, $k_{12}(t)$, $k_{21}(t)$, and $k_{22}(t)$ are related to $k_{11}'(t)$, $k_{12}'(t)$, $k_{21}'(t)$, and $k_{22}'(t)$ by time shifts and linear combinations. Specifically, $$k_{11}(t) = k_{11}'(t) - k_{21}'(t-\tau_2),$$

$$k_{12}(t) = k_{12}'(t) - k_{22}'(t-\tau_2),$$

$$k_{21}(t) = k_{21}'(t) - k_{11}'(t-\tau_1),$$

and $$k_{22}(t) = k_{22}'(t) - k_{12}'(t-\tau_1).$$

Note that $y_1(t)$ is contaminated by the term $k_{12}(t)*w_2(t)$, and that $y_2(t)$ is contaminated by the term $k_{21}(t)*w_1(t)$.

Several possible forms of the crosstalk remover have been described as part of the background of this invention, under the heading of convolutive blind source separation. In the present embodiment, the crosstalk remover forms discrete time sampled outputs 60 and 62 thus:

$$z_1(n) = y_1(n) - \sum_{k=1}^{1000} h_2(k) z_2(n-k)$$

$$z_2(n) = y_2(n) - \sum_{k=1}^{1000} h_1(k) z_1(n-k)$$

where the discrete time filters $h_1$ and $h_2$ correspond to elements 52 and 54 in FIG. 3 and are estimated adaptively. The filters $h_1$ and $h_2$ are strictly causal, i.e., they operate only on past samples of $z_1$ and $z_2$. This structure was described independently by Jutten et al. (1992) and by Platt and Faggin (1992).

The adaptation rule used for the filter coefficients in the preferred embodiment is a variant of the LMS rule ("Adaptive Signal Processing," Bernard Widrow and Samuel D. Stearns, Prentice-Hall, Englewood Cliffs, N.J., 1985, p 99). The filter coefficients are updated at every time-step n, after the new values of the outputs $z_1(n)$ and $z_2(n)$ have been calculated. Specifically, using these new values of the outputs, the filter coefficients are updated as follows:

$$h_1(k)[\text{new}] = h_1(k)[\text{old}] + m\, z_2(n) z_1(n-k) \quad k=1,2,\ldots,1000$$

$$h_2(k)[\text{new}] = h_2(k)[\text{old}] + m\, z_1(n) z_2(n-k) \quad k=1,2,\ldots,1000$$

where m is a constant that determines the rate of adaptation of the filter coefficients, e.g. 0.15 if the input signals 10 and 12 were normalized to lie in the range $-1 \leq x(t) \leq +1$. One skilled in the art will recognize that the filters $h_1$ and $h_2$ can be implemented in a variety of ways, including FIRs and lattice IIRs.

As described, the direct-signal separator 30 and crosstalk remover 50 adaptively bring about full separation of two sound sources mixed in an echoic, reverberant acoustic environment. However, the output signals $z_1(t)$ and $z_2(t)$ may be unsatisfactory in practical applications because they are colored versions of the original sources $w_1(t)$ and $w_2(t)$, i.e., $$z_1 = \zeta_1(t) * w_1(t)$$
$$z_2 = \zeta_2(t) * w_2(t)$$

where $\zeta_1(t)$ and $\zeta_2(t)$ represent the combined effects of the echoes and reverberations and of the various known signal transformations performed by the direct-signal separator 30 and crosstalk remover 50.

As an optional cosmetic improvement for certain commercial applications, it may be desirable to append filters 70 and 72 to the network. The purpose of these filters is to undo the effects of filters $\zeta_1(t)$ and $\zeta_2(t)$. As those familiar with the art will realize, a large body of techniques for performing this inversion to varying and predictable degrees of accuracy currently exist.

The embodiment of the signal processor 8 has been described in FIGS. 1-3 and 6-7 as being useful with two microphones 10 and 12 for separating two sound sources, A and B. Clearly, the invention is not so limited. The forthcoming section describes how more than two microphones and sound sources can be accomodated.

General case with M microphones and M sources

The invention is able to separate an arbitrary number M of simultaneous sources, as long as they are statistically independent, if there are at least M microphones.

Let $w_j(t)$ be the j'th source signal and $x_i(t)$ be the i'th microphone (mic) signal. Let $t_{ij}$ be the time required for sound to propagate from source j to mic i, and let $d(t_{ij})$ be the impulse response of a filter that delays a signal by $t_{ij}$. Mathematically, $d(t_{ij})$ is the unit impulse delayed by $t_{ij}$, that is $$d(t_{ij}) = \delta(t - t_{ij})$$

where $\delta(t)$ is the unit impulse function ("Circuits, Signals and Systems", by William McC. Siebert. The MIT Press, McGraw Hill Book Company, 1986, p. 319).

In the absence of echoes and reverberation, the i'th mic signal $x_i(t)$ can be expressed as a sum of the appropriately delayed j source signals $$x_i(t) = \sum_{j=1}^{M} d(t_{ij}) * w_j(t)$$

Matrix representation allows a compact representation of this equation for all M mic signals:

$$X(t) = D(t) * W(t)$$

where $X(t)$ is an M-element column vector whose i'th element is the i'th mic signal $x_i(t)$, $D(t)$ is an M×M element square matrix whose ij'th element (i.e., the element in the i'th row and j'th column) is $d(t_{ij})$, and $W(t)$ is an M-element column vector whose j'th element is the j'th source signal $w_j(t)$. Specifically, $$X(t) = \begin{bmatrix} x_1(t) \\ x_2(t) \\ \cdot \\ \cdot \\ \cdot \\ x_M(t) \end{bmatrix};$$

$$D(t) = \begin{bmatrix} d(t_{11}) & d(t_{12}) & \ldots & d(t_{1M}) \\ d(t_{21}) & d(t_{22}) & \ldots & d(t_{2M}) \\ \cdot & \cdot & & \cdot \\ \cdot & \cdot & & \cdot \\ \cdot & \cdot & & \cdot \\ d(t_{M1}) & d(t_{M2}) & \ldots & d(t_{MM}) \end{bmatrix};$$

$$W(t) = \begin{bmatrix} w_1(t) \\ w_2(t) \\ \cdot \\ \cdot \\ \cdot \\ w_M(t) \end{bmatrix}$$

For each source $w_j(t)$, if the delays $t_{ij}$ for $i=1,2,\ldots,M$ to the M mics are known (up to an arbitrary constant additive factor that can be different for each source), then M signals $y_j(t)$, $j=1,2,\ldots,M$, that each contain energy from a single but different source $w_j(t)$, can be constructed from the mic signals $x_i(t)$ as follows:

$$Y(t) = adjD(t) * X(t),$$
where

-continued $$Y(t) = \begin{bmatrix} y_1(t) \\ y_2(t) \\ \cdot \\ \cdot \\ \cdot \\ y_M(t) \end{bmatrix}$$

is the M-element column vector whose j'th element is the separated signal $y_j(t)$, and adjD(t) is the adjugate matrix of the matrix D(t). The adjugate matrix of a square matrix is the matrix obtained by replacing each element of the original matrix by its cofactor, and then transposing the result ("Linear Systems", by Thomas Kailath, Prentice Hall, Inc., 1980, p. 649). The product of the adjugate matrix and the original matrix is a diagonal matrix, with each element along the diagonal being equal to the determinant of the original matrix. Thus, $$\begin{aligned} Y(t) &= adjD(t) * X(t) \\ &= adjD(t) * D(t) * W(t) \\ &= \begin{bmatrix} |D(t)| & 0 & & 0\ldots 0 \\ 0 & |D(t)| & & 0\ldots 0 \\ \cdot & & \cdot & \\ \cdot & & & \cdot \\ \cdot & & & \cdot \\ 0 & 0 & \ldots & |D(t)| \end{bmatrix} * W(t) \\ &= |D(t)| * W(t) \end{aligned}$$

where $|D(t)|$ is the determinant of D(t). Thus, $$y_j(t)=|D(t)|*w_j(t) \text{ for } j=1,2,\ldots,M$$

$y_j(t)$ is a "colored" or filtered version of $w_j(t)$ because of the convolution by the filter impulse response $|D(t)|$. If desired, this coloration can be undone by post filtering the outputs by a filter that is the inverse of $|D(t)|$. Under certain circumstances, determined by the highest frequency of interest in the source signals and the separation between the mics, the filter $|D(t)|$ may have zeroes at certain frequencies; these make it impossible to exactly realize the inverse of the filter $|D(t)|$. Under these circumstances any one of the numerous techniques available for approximating filter inverses (see, for example, "Digital Filters and Signal Processing", by Leland B. Jackson, Kluwer Academic Publishers, 1986, p.146) may be used to derive an approximate filter with which to do the post filtering.

The delays $t_{ij}$ can be estimated from the statistical properties of the mic signals, up to a constant additive factor that can be different for each source. Alternatively, if the position of each microphone and each source is known, then the delays $t_{ij}$ can be calculated exactly. For any source that is distant, i.e., many times farther than the greatest separation between the mics, only the direction of the source is needed to calculate its delays to each mic, up to an arbitrary additive constant.

The first stage of the processor 8, namely the direct signal separator 30, uses the estimated delays to construct the adjugate matrix adjD(t), which it applies to the microphone signals X(t) to obtain the outputs Y(t) of the first stage, given by:

$$Y(t)=adjD(t)*X(t).$$

In the absence of echoes and reverberations, each output $y_j(t)$ contains energy from a single but different source $w_j(t)$.

When echoes and reverberation are present, each mic receives the direct signals from the sources as well as echoes and reverberations from each source. Thus $$x_i(t) = \sum_{j=1}^{M} d(t_{ij}) * w_j(t) + \sum_{j=1}^{M} e_{ij}(t) * w_j(t) \text{ for } i=1,2,\ldots,M$$

where $e_{ij}(t)$ is the impulse response of the echo and reverberation path from the j'th source to the i'th mic. All M of these equations can be represented in compact matrix notation by $$X(t)=D(t)*W(t)+E(t)*W(t)$$

where E(t) is the M×M matrix whose ijth element is the filter $e_{ij}(t)$.

If the mic signals are now convolved with the adjugate matrix of D(t), instead of obtaining separated signals we obtain partially separated signals:

$$\begin{aligned} Y(t) &= adjD(t)*X(t) \\ &= |D(t)|*W(t) + adjD(t)*E(t)*W(t) \end{aligned}$$

Notice that each $y_j(t)$ contains a colored direct signal from a single source, as in the case with no echoes, and differently colored components from the echoes and reverberations of every source, including the direct one.

The echoes and reverberations of the other sources are removed by the second stage of the network, namely the crosstalk remover 50, which generates each output as follows:

$$z_j(t) = y_j(t) - \sum_{\substack{k=1 \\ k \neq j}}^{M} h_{jk}(t) * z_k(t) \text{ for } j=1,2,\ldots,M$$

where the entities $h_{jk}(t)$ are causal adaptive filters. (The term "causal" means that $h_{jk}(t)=0$ for $t \leq 0$.) In matrix form these equations are written as $$Z(t)=Y(t)-H(t)*Z(t)$$

where Z(t) is the M-element column vector whose j'th element is $z_j(t)$, and H(t) is an M×M element matrix whose diagonal elements are zero and whose off diagonal elements are the causal, adaptive filters $h_{jk}(t)$.

These filters are adapted according to a rule that is similar to the Least Mean Square update rule of adaptive filter theory ("Adaptive Signal Processing," Bernard Widrow and Samuel D. Stearns, Prentice-Hall, Englewood Cliffs, N.J., 1985, p. 99).

This is most easily illustrated in the case of a discrete time system.

Illustrative weight update methodology for use with a discrete time representation First, we replace the time parameter t by a discrete time index n. Second, we use the notation H(n)[new] to indicate the value of H(n) in effect just before computing new outputs at time n. At each time step n, the outputs Z(n) are computed according to $$Z(n)=Y(n)-H(n)[new]*Z(n)$$

Note that the convolution on the right hand side involves only past values of Z, i.e. Z(n−1),Z(n−2), ... , Z(n−N), because the filters that are the elements of H are causal. (N is defined to be the order of the filters in H).

Now new values are computed for the coefficients of the filters that are the elements of H. These will be used at the next time step. Specifically, for each j and each k, with j≠k, perform the following:

$$h_{jk}(u)[\text{old}] = h_{jk}(u)[\text{new}] \qquad u = 1, 2, \ldots, M$$

$$h_{jk}(u)[\text{new}] = h_{jk}(u)[\text{old}] + \mu_{jk} z_j(n) z_k(n-u) \qquad u = 1, 2, \ldots, M$$

The easiest way to understand the operation of the second stage is to observe that the off-diagonal elements of H(t) have zero net change per unit time when the products like $z_j(t)z_k(t-u)$ are zero on average. Because the sources in W are taken to be statistically independent of each other, those products are zero on average when each output $z_j(t)$ has become a colored version of a different source, say $w_j(t)$. (The correspondence between sources and outputs might be permuted so that the numbering of the sources does not match the numbering of the outputs.)

More specifically, let $Z(t)=\psi(t)*W(t)$. From the preceding paragraph, equilibrium is achieved when $\psi(t)$ is diagonal. In addition, it is required that:

$$\begin{aligned} Z(t) &= Y(t) - H(t)*\Psi(t)*W(t) \\ &= |D(t)|*W(t) + adjD(t)*E(t)*W(t) - H(t)*\Psi(t)*W(t) \\ &= (|D(t)|I + adjD(t)*E(t) - H(t)*\Psi(t))*W(t) \end{aligned}$$

so that $$\Psi(t) = |D(t)|I + adjD(t)*E(t) - H(t)*\Psi(t)$$
$$\Psi(t) = [1 + H(t)]^{-1}[|D(t)|I + adjD(t)*E(t)]$$

This relation determines the coloration produced by the two stages of the system, taken together.

An optional third stage can use any one of numerous techniques available to reduce the amount of coloration on any individual output.

Example of general case with M=3, i.e. with 3 mics and 3 sources

In the case where there are 3 mics and 3 sources, the general matrix equation $$X = D*W$$

becomes $$\begin{bmatrix} x_1 \\ x_2 \\ x_3 \end{bmatrix} = \begin{bmatrix} d(t_{11})d(t_{12})d(t_{13}) \\ d(t_{21})d(t_{22})d(t_{23}) \\ d(t_{31})d(t_{32})d(t_{33}) \end{bmatrix} * \begin{bmatrix} w_1 \\ w_2 \\ w_3 \end{bmatrix}$$

If the delays $t_{ij}$ are known, then the adjugate matrix of D(t) is given by $$adjD = \begin{bmatrix} d(t_{22}+t_{33}) - d(t_{23}+t_{32})d(t_{13}+t_{32}) - d(t_{12}+t_{33})d(t_{12}+t_{23}) - d(t_{22}+t_{13}) \\ d(t_{23}+t_{31}) - d(t_{21}+t_{33})d(t_{11}+t_{33}) - d(t_{13}+t_{31})d(t_{21}+t_{13}) - d(t_{11}+t_{23}) \\ d(t_{21}+t_{32}) - d(t_{22}+t_{31})d(t_{12}+t_{31}) - d(t_{11}+t_{32})d(t_{11}+t_{22}) - d(t_{21}+t_{12}) \end{bmatrix}$$

Note that adding a constant delay to the delays associated with any column of D(t) leaves the adjugate matrix unchanged. This is why the delays from a source to the three mics need only be estimated up to an arbitrary additive constant.

The output of the first stage, namely the direct signal separator 30, is formed by convolving the mic signals with the adjugate matrix.

$$\begin{bmatrix} y_1 \\ y_2 \\ y_3 \end{bmatrix} = adjD * \begin{bmatrix} x_1 \\ x_2 \\ x_3 \end{bmatrix}$$

Figure 4:
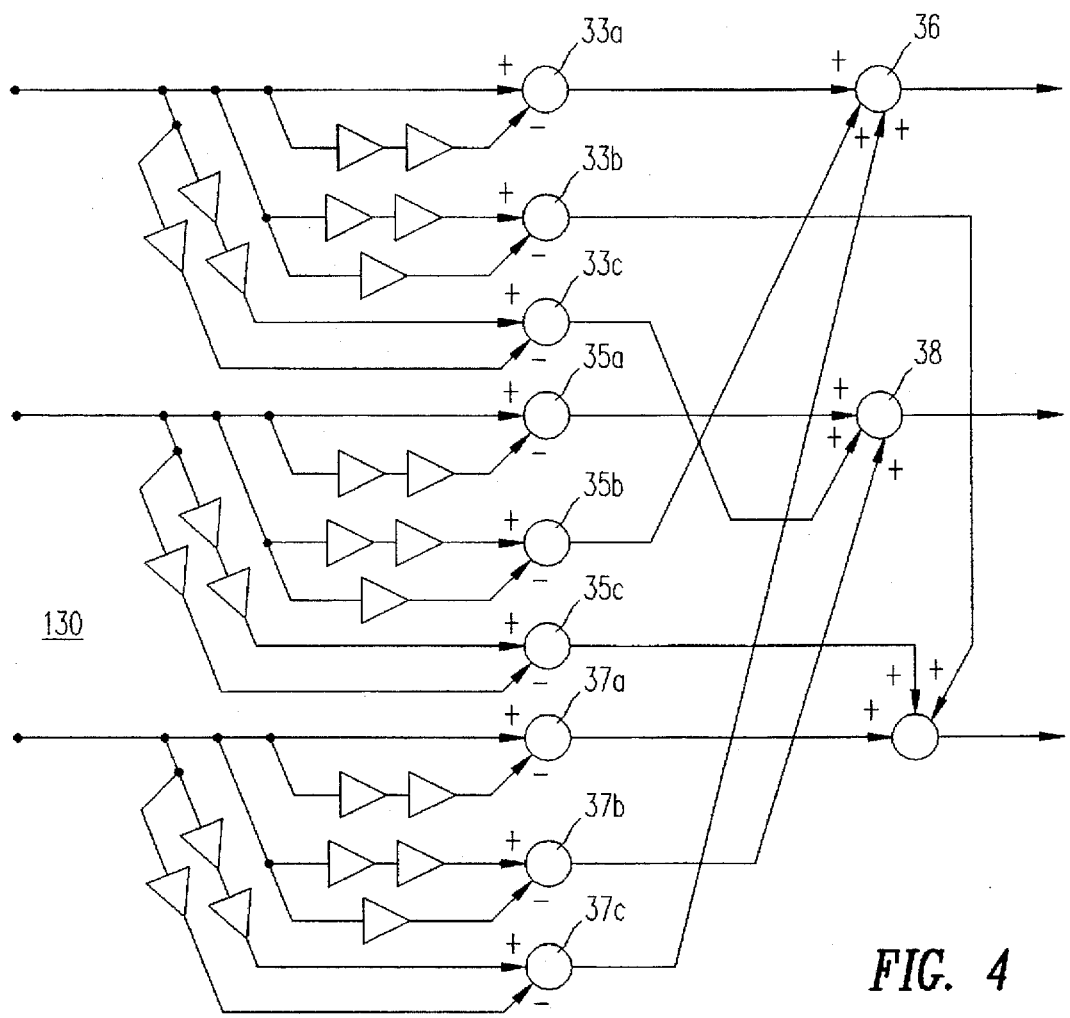
FIG. 4 is a schematic block diagram of an embodiment of a direct-signal separator suitable for use with an acoustic signal processor employing three microphones.

The network that accomplishes this is shown in FIG. 4.

In the absence of echoes and reverberations, the outputs of the first stage are the individual sources, each colored by the determinant of the delay matrix.

$$\begin{bmatrix} y_1(t) \\ y_2(t) \\ y_3(t) \end{bmatrix} = adjD*D(t) \begin{bmatrix} w_1(t) \\ w_2(t) \\ w_3(t) \end{bmatrix} = |D(t)|* \begin{bmatrix} w_1(t) \\ w_2(t) \\ w_3(t) \end{bmatrix}$$

Figure 5:
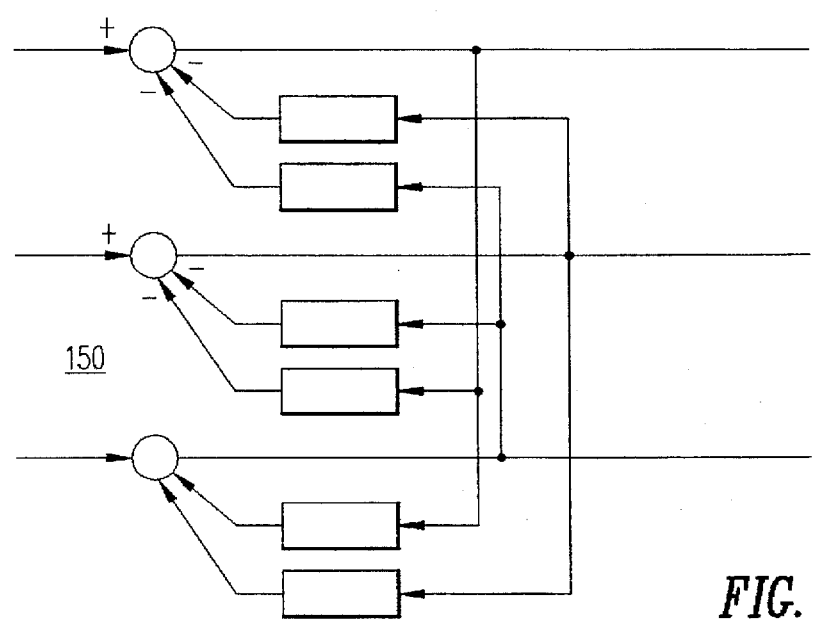
FIG. 5 is a schematic block diagram of an embodiment of a crosstalk remover suitable for use with an acoustic signal processor employing three microphones.

In the general case when echoes and reverberation are present, each output of the first stage also contains echoes and reverberations from each source. The second stage, namely the cross talk remover 50, consisting of a feedback network of adaptive filters, removes the effects of these unwanted echoes and reverberations to produce outputs that each contain energy only one different source, respectively. The matrix equation of the second stage $$Z = Y - H*Z$$

becomes $$\begin{bmatrix} z_1(t) \\ z_2(t) \\ z_3(t) \end{bmatrix} = \begin{bmatrix} y_1(t) \\ y_2(t) \\ y_3(t) \end{bmatrix} - \begin{bmatrix} 0 & h_{12}(t) & h_{13}(t) \\ h_{21}(t) & 0 & h_{23}(t) \\ h_{31}(t) & h_{32}(t) & 0 \end{bmatrix} * \begin{bmatrix} z_1(t) \\ z_2(t) \\ z_3(t) \end{bmatrix}$$

where each $h_{ij}$ is a causal adaptive filter. The network that accomplishes this is shown in FIG. 5.

It should be noted that the number of microphones and associated channels of signal processing need not be as large as the total number of sources present, as long as the number of sources emitting a significant amount of sound at any given instant in time does not exceed the number of microphones. For example, if during one interval of time only sources A and B emit sound, and in another interval of time only sources B and C emit sound, then during the first interval the output channels will correspond to A and B respectively, and during the second interval the output channels will correspond to B and C respectively.

Figure 8:
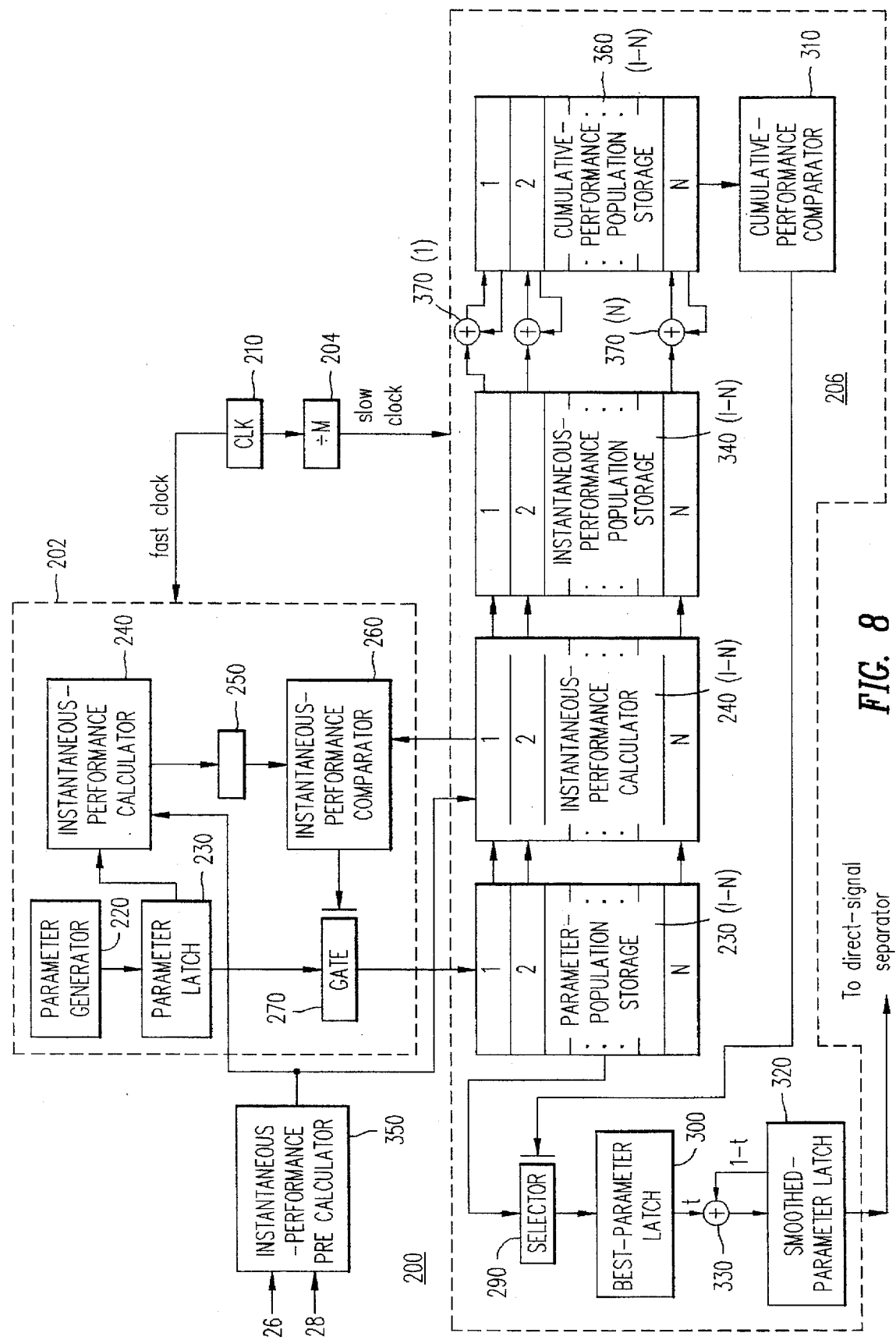
FIG. 8 is a schematic block level diagram of an embodiment of the DOA estimator of the present invention for use in the acoustic signal processor of FIG. 1.

Referring to FIG. 8 there is shown a block level schematic diagram of a direction of arrival estimator 200 of the present invention. The direction of arrival estimator 200 may be used with the direct signal separator 30 shown in FIG. 1 to form an adaptive filter signal processor.

As previously described, the function of the direct signal processor 30 is to receive digital acoustic signals 26 and 28 (for the two microphone embodiment shown in FIG. 1), represented as $x_1(t)$, and $x_2(t)$, respectively, where they are:

$$x_1(t) = w_1(t) + w_2(t-\tau_2)$$

$$x_2(t) = w_2(t) + w_1(t-\tau_1),$$

and process them to obtain the processed signals of $y_1(t)$ and $y_2(t)$, which correspond to signals 40 and 42:

$$y_1(t) = x_1(t) - x_2(t-\tau_2) = w_1(t) - w_1(t-(\tau_1+\tau_2))$$

$y_2(t)=x_2(t)-x_1(t-\tau_1)=w_2(t)-w_2(t-(\tau_1+\tau_2))$

Under anechoic conditions, i.e., in the absence of echoes and reverberations of said acoustic waves from said plurality of sources, each of said first processed acoustic signals, $y_1(t)$ and $y_2(t)$, represent acoustic waves from only one different source. To achieve such result, the variables $\tau_1$ and $\tau_2$, must match the actual delay of the acoustic waves from the source reaching the microphones 10 and 12 as shown graphically in FIG. 6. In the embodiment described heretofore, the variables $\tau_1$ and $\tau_2$ are supplied from the DOA estimator 20. At best, however, this is only an estimation. The aim of the present invention is to perform this estimation accurately and rapidly.

In FIG. 8, the preferred embodiment of the Direction of Arrival estimator 200 of the present invention is shown as receiving two input sample signals 26 and 28. However, as is clearly described heretofore, the present invention is not so limited, and those skilled in the art will recognize that the present invention may be used to process any number of input signals. As the number of input signals rises, the task of estimating directions of arrival becomes more computationally intensive. Nonetheless, the number of input signals that the present invention can process is limited only by the available data and computational resources, not by a fundamental principle of operation.

The purpose of direction-of-arrival estimator 200 is to estimate a pair of delay values, namely $\tau_1$ and $\tau_2$, that are consistent with the input signals $x_1(t)$ and $x_2(t)$ in the manner described above. For purpose of discussion, a pair of delay values is termed a set of parameter values.

A clock 210 is present in the preferred embodiment and runs at a "fast" rate of, e.g. a multiple times 100 cycles per second. The fast clock rate is supplied to the block 202, which comprises the parameter generator 220, the parameter latch 230, the instantaneous-performance calculator 240, the instantaneous-performance latch 250, and the instantaneous-performance comparator 260, and the gate 270.

The "fast" clock rate of multiple times 100 cycles per second is then divided by a divider 204, which yields a "slow" clock rate of, e.g. 100 cycles per second. The "slow" clock rate is supplied to the components in block 206, each of which executes once per each "slow" clock cycle. The order of their execution is obvious from FIG. 8. Although the "fast" and "slow" clock rates are described here as running synchronously, one skilled in the art will recognize that their operation could be made asynchronous without departing from the spirit and scope of the invention.

Parameter sets originate at the parameter generator 220. Each time a parameter set is created, it is supplied to the parameter latch 230 for temporary storage. The first N parameter sets that arrive at the parameter latch 230 are stored in the parameter population storage 230(1-N), which holds N parameter sets, where N is 80 to 100 in the preferred embodiment. Thereafter, a parameter set is transferred from the parameter latch 230 to the parameter population storage 230(1-N) (and a parameter set previously in the parameter population storage 230(1-N) is discarded) only at times determined by the state of the gate 270, which in turn is determined by conditions described below.

Once per "slow" clock cycle, one parameter set is copied from the parameter population storage 230(1-N) to the best-parameter latch 300. Which parameter set is copied is determined by selector 290 using information from the cumulative-performance comparator 310, whose operation is described below. The parameter set in the smoothed-parameter latch 320 is updated via a leaky integrator 330 from the value in the best-parameter latch 300. In the preferred embodiment, the leaky integrator 330 performs the operation of $\tau_i(\text{new})=(1-\epsilon)\tau_i(\text{old})+(\epsilon)\tau_i(\text{best-parameter latch})$ where the constant $\epsilon$ is set as follows:

$\epsilon=(\tfrac{1}{2})^{(1/k)}$ where k is about 10, so that the leaky integrator has a half-life of approximately 10 clock cycles. At each "slow" clock cycle, the parameter set in the smoothed-parameter latch 320 is supplied to the direct-signal separator 30.

It remains to describe (a) the conditions under which the gate 270 opens, (b) how a parameter set in the parameter population storage 230(1-N) is chosen to be discarded each time the gate 270 opens, and (c) how the selector 290 chooses a parameter set to copy from the parameter population storage 230(1-N), based on information from the cumulative-performance comparator 310.

Item (a). Each time a parameter set, generated by the parameter generator 220, arrives at the parameter latch 230, it is supplied to the instantaneous-performance calculator 240 for operation thereon. Also, at each "slow" clock cycle, the N parameter sets in the parameter population storage 230(1-N) are supplied to the bank of N instantaneous-performance calculators 240(1-N) for operation thereon. The performance value computed by the instantaneous-performance calculator 240 is supplied to the instantaneous-performance latch 250. At the same time, the plurality of performance values computed by the plurality of instantaneous performance calculators 240(1-N) are supplied to a plurality of instantaneous-performance population storage 340(1-N), respectively.

The values in the instantaneous-performance population storage 340(1-N) may change even during a "slow" clock cycle in which the contents of the parameter-population storage 230(1-N) do not change, since they depend on the input signals 26 and 28, $x_1(t)$ and $x_2(t)$, which do change.

Each of the instantaneous-performance calculators 240(1-N) and 240, calculates an instantaneous-performance value for the given parameter set in accordance with:

instantaneous performance value$=-$protlog$[a_0, E\{y_1(t)^*y_2(t)\}^2]$.

The notation $E\{\bullet\}$ denotes a time-windowed estimate of the expected value of the enclosed expression, as computed by a time average. In the preferred embodiment, this time average is computed over 50 milliseconds. The notation protlog$[a_0,a]$ denotes a protected logarithm:

$$\text{protlog}[a_0,a] = \log[a] \quad \text{if } a > a_0$$
$$= \log[a_0] \quad \text{otherwise.}$$

As will be seen, the value of $y_1(t)^*y_2(t)$ is related to the input signals 26 and 28, and also depends on the values of $\tau_1$ and $\tau_2$ in a parameter set. Parameter sets with higher instantaneous performance values are deemed more consistent with recent input data $x_1(t)$ and $x_2(t)$ than are parameter sets with lower instantaneous performance values. The strategy of the remainder of the invention is to identify those parameter sets in the parameter population storage 230(1-N) that exhibit the highest instantaneous performance values consistently over time.

The instantaneous-performance calculator 240 and the N instantaneous-performance calculators 240(1-N) employ values supplied by the instantaneous-performance precalculator 350, which performs operations on the input data 26 and 28 that would otherwise constitute effort duplicated across the N+1 instantaneous-performance calculators 240 and 240(1–N). In particular, the quantity $E\{y_1(t)*y_2(t)\}$ can be computed without explicitly computing $y_1(t)$ and $y_2(t)$ (see theory section, below).

Each time a value arrives at the instantaneous-performance latch 250, it is compared by the instantaneous-performance comparator 260 with the least value in the instantaneous-performance population storage 240(1–N). If it is less, the gate 270 remains closed. If it is greater, the gate 270 opens.

Item (b). At each "slow" clock cycle, each value in the instantaneous-performance population storage 340(1–N) is added to the corresponding value in the cumulative-performance population storage 360(1–N) by one of the adders in the bank of adders 370(1–N). Thus, each cell in the cumulative-performance population storage 360(1–N) maintains a cumulative sum of instantaneous-performance values. Other embodiments could employ a weighted sum or other arithmetic operation for incorporating new instantaneous-performance values into the cumulative performance.

Each time the gate 270 opens, the parameter set currently in the parameter latch 230 is copied to the parameter population storage 230(1–N), replacing the parameter set with least cumulative performance. Its cumulative performance is initialized to a value that falls short of the greatest value in the cumulative-performance population storage by a fixed amount determined in advance. This fixed value is chosen so that the cumulative performance of the parameter set newly introduced into the parameter-population storage 230(K) cannot exceed the currently greatest cumulative performance in the cumulative-performance population storage 360(1–N) until sufficient time has elapsed for the statistics to be reasonably reliable. In the preferred embodiment, sufficient time is deemed to be 100 milliseconds.

Item (c). At each "slow" clock cycle, the cumulative-performance comparator 310 identifies the greatest value in the cumulative-performance population storage 360(1–N) and supplies the index (1 through N) of that value to the selector 290. The selector 290 copies the corresponding parameter set from the parameter population storage 230 (1–N) to the best-parameter latch 300 for further processing as described above.

The generator 220 can generate $\tau_1$ and $\tau_2$ in a number of different ways. First the generator 220 can draw the delay values randomly from a predetermined distribution of $\tau_1$ and $\tau_2$ values. Secondly, the values of $\tau_1$ and $\tau_2$ can be estimated from the incoming data streams using crude methods that exist in the prior art. Alternatively they can be variants of existing values of $\tau_1$ and $\tau_2$. The values of $\tau_1$ and $\tau_2$ can also be based upon prior models of how the sources of the acoustic waves are expected to move in physical space. Further, the values of $\tau_1$ and $\tau_2$ can be determined by another adaptive filtering method, including well known conventional methods such as a stochastic-gradient method. Finally, if the number and required resolution of the filter coefficients are low enough that the initial sets of delay values contain all the possible delay values, then clearly the generator 220 can even be omitted.

Theory

Problems in adaptive filtering can generally be described as follows. One or more time-varying input signals $x_i(t)$ are fed into a filter structure H with adjustable coefficients $h_k$, i.e., $H=H(h_1,h_2,\ldots)$. Output signals $y_i(t)$ emerge from the filter structure. For example, an adaptive filter with one input $x(t)$ and one output $y(t)$ in which H is a linear, causal FIR filter might take the form:

$$y(t) = \sum_{k=0}^{N} h_k x(t - k\Delta t).$$

In general, H might be a much more complicated filter structure with feedback, cascades, parallel elements, non-linear operations, and so forth.

The object is to adjust the unknowns $h_k$ such that a performance function $C(t)$ is maximized consistently over time. The performance function is usually a statistic computed over recent values of the outputs $y_i(t)$; but in general, it may also depend on the input signals, the filter coefficients, or other quantities such as parameter settings supplied exogenously by a human user.

For example, consider the 2×2 case of the preferred embodiment of the direct-signal separator 30. Each of the input signals, $x_1(t)$ or $x_2(t)$, comes from one omnidirectional microphone. Each omnidirectional microphone receives energy from two source signals, $s_1(t)$ and $s_2(t)$. The structure H is a feed-forward network, with time delays, that implements the following relations:

$$y_1(t)=x_1(t)-x_2(t-\tau_2),$$

and $$y_2(t)=x_2(t)-x_1(t-\tau_1).$$

The adjustable coefficients are $\tau_1$ and $\tau_2$; i.e., $H=H(\tau_1,\tau_2)$. Note that even when the signals are sampled, $\tau_1$ and $\tau_2$ need not be integral multiples of $\Delta t$.

The goal is to recover versions of $s_1(t)$ and $s_2(t)$, possibly after some frequency coloration, from $x_1(t)$ and $x_2(t)$, i.e., to make $y_1(t)$ be a filtered version of $s_1(t)$ only, and $y_2(t)$ a filtered version of $s_2(t)$ only, or vice versa.

The pivotal assumption is that $s_1(t)$ and $s_2(t)$ are statistically independent. For mathematical convenience, it is also assumed that both have (possibly different) probability distributions symmetric about zero. (For example, speech signals have probability distributions that are sufficiently symmetric about zero, though not perfectly so.) These two assumptions imply that $$E[f(s_1(t))g(s_2(t))]=0$$

holds for every possible choice of the two odd functions f and g. (The notation $E[\bullet]$ denotes a time-windowed estimate of the expected value of the enclosed expression, as computed by a time average. In the preferred embodiment, this time average is computed over 50 milliseconds. Typical weighting functions are rectangular or exponential, but many others are also used.)

In the absence of noise, echoes, reverberation, and certain mathematical degeneracies, the desired goal is accomplished when H is set such that the relation of statistical independence holds for $y_1(t)$ and $y_2(t)$ as well, i.e., $$E[f(y_1(t))g(y_2(t))]=0$$

for every possible choice of the two odd functions f and g.

To specify these conditions in a form appropriate for the present invention, it is necessary to define some performance function $C(t)$ that is largest when the conditions of statistical independence are closest to being satisfied. In practice, a number of choices must be made in the definition of $C(t)$. First, although the number of equations that must be satisfied for true statistical independence is infinite, it is generally necessary to choose a small number of pairs of functions f and g for which the equations are to be satisfied.

Second, the time window over which the expectation operator E[●] performs averaging must be chosen. Third, the averages used to compute the function C(t) can be defined in one of two ways: direct or retrospective.

Each of these choices can affect the speed at which the system adapts to changes in the configuration of sources, and the computational demands that it places on the underlying hardware. With some combinations of these choices, including those made in the preferred embodiment, the present invention provides advantages not found with competing methods such as LMS or RLS.

We now discuss the three choices, their effects on speed and efficiency, and the conditions under which the present invention provides unique advantages.

The first choice concerns which pairs of f and g functions to use in enforcing the statistical independence conditions. One familiar with the art will recognize that a variety of ways to enforce the statistical-independence relations exist, and that any one of these could be used without departing from the spirit and scope of the invention. In the preferred embodiment of the present invention, the relations are enforced by incorporating them into a least-squares error function of the following form:

$$e(t) = \sum_k c_k e_k(t),$$

where $c_k$ is a weighting factor, $$e_k(t) = \{E[f_k(y_1(t))g_k(y_2(t))]\}^2,$$

and $f_k$ and $g_k$ are odd functions. Often they are defined to be odd polynomial terms, e.g., $f_k(y)=y^3$. The goal is to maximize $e(t)$. The performance function C(t) is then defined thus:

$$C(t) = \text{protlog}[a_0, e(t)],$$

and the goal is then to maximize C(t). The notation protlog $[a_0, a]$ denotes a protected logarithm:

$$\text{protlog}[a_0, a] = \log[a] \quad \text{if } a > a_0$$
$$= \log[a_0] \quad \text{otherwise.}$$

In the preferred embodiment, the bound $a_0$ is equal to 1e–20.

Given this definition of C(t), the first choice amounts to the selection of odd functions $f_k$ and $g_k$ and weighting coefficients $c_k$. Each function $f_k$ and $g_k$ can be linear or nonlinear, and any number of pairs of f and g functions can be used. These choices have been debated extensively in the published literature because they involve a tradeoff between performance and mathematical sufficiency. On one hand, raw performance issues call for the number of pairs of functions f and g to be small, and for the functions themselves to be simple; otherwise C(t) becomes intensive to compute, difficult to optimize (because of multiple competing optima), and sensitive to noise. On the other hand, if those guidelines are carried too far, the performance function C(t) becomes "instantaneously underdetermined." That is, at any given time t, the relation e(t)=0 does not uniquely determine H; the value of H that causes $y_1(t)$ and $y_2(t)$ to be filtered versions of $s_1(t)$ and $s_2(t)$ is only one of a family of values of H that satisfy e(t)=0.

The second choice pertains to the length of the window over which the expectation operator E[●] performs averaging. This choice gives rise to a tradeoff between adaptation rate and fluctuation. On one hand, if averaging times are too long, the system will adapt to changes slowly because the statistics that make up C(t) change slowly. On the other hand, if the averaging times are too short, C(t) will be noisy. Moreover, within short time windows it is possible for the pivotal assumption of statistical independence to be violated transiently.

The third choice pertains to precisely how the averaging done by the expectation operator E[●] is defined. This choice has an impact on how quickly and accurately the invention can adapt to the incoming signals. Consider the expression $E[f_k(y_1(t))g_k(y_2(t))]$, which involves averaging over the outputs of the invention. The outputs depend, in turn, on the transfer function H, which varies in time as the invention adapts to the incoming signals. One method is to perform the time average using the actual past values of $y_1(t)$ and $y_2(t)$. This is the conventional averaging procedure. Although simpler to implement, this method creates a problem: the averaging window may include past times during which the output signals $y_1(t)$ and $y_2(t)$ were computed with past values of H that were either much better or much worse than the current H at separating the sources. Consequently, with conventional averaging the performance function C(t) is not an accurate measure of how well the invention is currently separating the signals.

The alternative is to perform the averaging retrospectively: compute the time average using the past values that $y_1(t)$ and $y_2(t)$ would have taken, had the current value of H been used to compute them. This way, the performance function C(t) is a more accurate measure of the performance of the current value of H, and adaptation to movement of the sources can occur more quickly. However, this method of computing the average calls for a somewhat more complicated technique for processing the input signals $x_1(t)$ and $x_2(t)$. The technique used in the preferred embodiment is described below.

A key advantage of the present invention over existing adaptive filtering techniques is its relative imperviousness to the effects of mathematical insufficiency and fluctuation in C(t), relative to existing methods for performing adaptive filtering. These properties permit the first two choices to be made in a manner that favors performance and adaptation rate.

In particular, consider the behavior of the performance function C(t) in the preferred embodiment. Only one pair of functions f, g is used, and both functions are linear: f(y)=y; g(y)=y, so that C(t) is maximized by driving the expression $$E[y_1(t)y_2(t)]$$

as close as possible to zero. This condition, known as decorrelation, is a much less stringent condition than statistical independence. It has long been recognized in the literature (see, for example, Cardoso, 1989) that decorrelation over a single time window, even a long one, is an insufficient condition for source separation. In the terms used here, the resulting performance function is instantaneously underdetermined. Moreover, in the preferred embodiment, the expectation operator E[●] averages over a very short time window: 50 milliseconds; this causes the performance function C(t) to be sensitive to noise and transient departures from statistical independence of the sources.

It is under conditions of instantaneous underdetermination and rapid fluctuation of C(t) that the greatest advantages of the present invention over prior art are realized. The so-called Least Squares methods, of which Recursive Least Squares (RLS) is the archetype, cannot be used because they effectively compute, at each time step, a unique global optimum of the performance function. (RLS performs this computation in an efficient manner by updating a past solution with data from the current time window; nonetheless, the resulting solution is the unique global optimum.) In the presence of instantaneous underdetermination, no unique global optimum exists.

Under conditions of instantaneous underdetermination, LMS and GA solutions exist but are expected to fail. This is because both methods attempt to move toward the global optimum of the performance function at any given instant in time, using the gradient of the performance function. Under the conditions of instantaneous underdetermination presently under discussion, the theoretical global optimum is not a single point on the performance surface, but an infinite collection of points spread over a large region of the parameter space. At any given instant, LMS or GA techniques will attempt to move their parameter estimates toward one of these optimal points. Subsequent linear smoothing will produce a weighted mean of these estimates, which in general may be very different from the ideal value. Instead of producing a weighted mean of estimates, the present invention effectively calculates a weighted mode: it chooses the single estimate that most consistently optimizes the performance surface over time.

The present invention copes well with instantaneous underdetermination only under certain conditions. In particular, the preferred embodiment of the present invention exploits the fact that if the sources $s_1(t)$ and $s_2(t)$ vary in their relative power, as is true in conversational speech, the relation $e(t)=0$ holds true consistently over time only for the correct value of H. Other values of H can satisfy the relation only transiently. The behavior of the present invention is to choose $\tau_1$ and $\tau_2$ such that C(t) is maximized consistently over time.

The strategy of maximizing C(t) consistently over time is an advantage of the present invention over existing LMS and GA based algorithms even when instantaneous undetermination is absent and a weighted mean does converge to the ideal parameters. Even under such favorable conditions, LMS and GA based algorithms may still produce a parameter set that fluctuates rapidly, albeit with values centered about the ideal. For certain applications, these fluctuations would detract from the usefulness or attractiveness of the system. They may be removed by the conventional technique of linear smoothing, but usually at the expense of adaptation speed: the system will react slowly to true changes in the ideal parameters. In contrast, the present invention can produce non-fluctuating parameters while retaining the ability to adapt quickly. This is because noise fluctuations (and fluctuations in C(t) due to transient departures of the sources from statistical independence) are translated into fluctuations in the cumulative performance values, not in the parameters themselves.

An important advantage of the present invention over the so-called Least-Squares methods, of which Recursive Least Squares (RLS) is the archetype, is its generality. Least-Squares methods can be used only when the form of C(t) permits its global maximum to be computed analytically. The present invention has no such requirement.

In the present invention, the third choice (conventional vs. retrospective averaging) is especially critical. The invention relies on being able to obtain a rapid, accurate estimate of how well a given trial value of H would separate the signals, and therefore essentially requires that averaging be performed retrospectively. In addition, unlike conventional averaging, retrospective averaging can permit the bulk of the processing effort to be performed in a precomputation step that is common to all population members.

In the preferred embodiment, this precomputation proceeds as follows. As previously discussed, the purpose of the performance calculator is to calculate C(t) in accordance with:

$$C(t) = -\text{protlog}[a_0, e^2(t)],$$

where $$e(t) = E[y_1(t) * y_2(t)].$$

The expectation operator $E[\bullet]$ is expensive to calculate, but the computation can be structured so that multiple calculations of C(t) for the same time but different $\tau_1$ and $\tau_2$ can share many operations. Since, as described above, the time delay $\tau_1$ and $\tau_2$ are implemented by convolution with a sinc-shaped filter $w_1$:

$$y_1(t) = x_1(t) - \sum_{k_2} w_2(\tau_2, k_2) x_2(t - k_2 \Delta t)$$

$$y_2(t) = x_2(t) - \sum_{k_1} w_1(\tau_1, k_1) x_1(t - k_1 \Delta t),$$

and since the expectation operator $E[\bullet]$ is linear, it follows that the quantity in question can be expressed as follows:

$$E\{y_1(t)y_2(t)\} = E\{x_1(t)x_2(t)\} - \sum_{k_1} w_1(\tau_1,k_1)e_{12}(k_1,0) -$$

$$\sum_{k_2} w_2(\tau_2,k_2)e_{12}(0,k_2) +$$

$$\sum_{k_1}\sum_{k_2} w_1(\tau_1,k_1)w_2(\tau_2,k_2)e_{12}(k_1,k_2),$$

where $w_1$ and $w_2$ are coefficients that depend on the delays but not the input data, and $$e_{12}(k_1,k_2) = E\{x_1(t-k_1\Delta t)x_2(t-k_2\Delta t)\}.$$

The quantity $e_{12}(k_1,k_2)$ can be precalculated once per clock cycle for each $(k_1,k_2)$ pair, leaving the sums over $k_1$ and $k_2$ to be calculated once for each $\tau_1$, $\tau_2$ parameter set.

When the number of input channels exceeds two, the quantity $$e_{ij}(k_i,k_j) = E\{x_i(t-k_i\Delta t)x_j(t-k_j\Delta t)\}$$

must be precalculated for every (i,j) pair, and for each such pair, for every $(k_i,k_j)$ pair.

In the preferred embodiment of the present invention, the invention has been implemented in software, as set forth in the microfiche appendix. The software code is written in the C++ language for execution on a workstation from Silicon Graphics. However, as previously discussed, hardware implementation of the present invention is also contemplated to be within the scope of the present invention. Thus, for example, the direct signal separator 30 and the crosstalk remover 50 can be a part of a digital signal processor, or can be a part of a general purpose computer.

What is claimed is:

1. A method of determining a set of a plurality of signal parameters for use in an adaptive filter signal processor to process a plurality of input signals to generate a plurality of processed signals, said method comprising:

a) generating a fixed plurality of sets;

b) storing said fixed plurality of sets;

c) generating a plurality of cumulative performance values, with a cumulative performance value corresponding to each of said fixed plurality of sets;

d) comparing said plurality of cumulative performance values, e) choosing one of said plurality of cumulative performance values, based upon said comparison;

f) processing said plurality of input signals for a duration of time using one set, corresponding to said chosen one cumulative performance value, from said stored fixed plurality of sets to generate the plurality of processed signals;

g) generating a new set of a plurality of signal parameters;

h) generating a plurality of cumulative performance values for said new set and for each of said stored fixed plurality of sets;

i) comparing said plurality of cumulative performance values generated in step (h), j) choosing one of said plurality of cumulative performance values generated in step (h), based upon the comparing step of (i);

k) based upon the comparing step of (i), either:
 i) replacing one of said stored fixed plurality of sets, by said new set; or
 ii) deleting said new set;

l) processing said plurality of input signals for a duration of time using one set, corresponding to said chosen one cumulative performance value, from said stored fixed plurality of sets to generate the plurality of processed signals; and m) periodically reverting to steps (g)–(l).

2. The method of claim 1, wherein said generating step (h) comprising arithmetically combining random values from a pseudorandom number generator, one set in said plurality of sets, and recent values in said plurality of input signals.

3. The method of claim 1 wherein:

said comparing step (i) compares the cumulative performance value of said new set with the cumulative performance values of one of said stored fixed plurality of sets having a least performance value;

and wherein said replacing step (k)(i) replaces one of said stored fixed plurality of sets having said least performance value.

4. The method of claim 1 wherein:

said generating step (h) further comprises generating an initial cumulative performance value for said new set by subtracting a fixed value from a cumulative performance value of one of said stored fixed plurality of sets having the greatest cumulative performance value; and wherein said choosing step (j) chooses one of said plurality of cumulative performance values generated in step (h) having the largest cumulative performance value.

5. The method of claims 1, 2, 3, or 4 wherein said generating steps of (c) and (h) further comprises:

generating a plurality of instantaneous performance values, each at a different time, for each set; and combining said plurality of instantaneous performance values for each set to generate said plurality of cumulative performance values; and wherein said plurality of input signals is characterized as $x_1(t), x_2(t), \ldots, x_n(t)$, said plurality of processed signals is characterized as $y_1(t), y_2(t), \ldots, y_n(t)$, and each of said choosing steps (e) and (j) selects a set having associated instantaneous performance values that are highest for the sets that would generate processed signals $y_i(t)$ and $y_j(t)$, that are most statistically independent for different i and j.

6. The method of claim 5 wherein said plurality of input signals and said plurality of processed signals are assumed to have zero mean and to fluctuate in power over a few clock cycles, and said choosing steps (e) and (j) selects a set for which the associated instantaneous performance values are highest for the sets that would generate processed signals $y_i(t)$ and $y_j(t)$ that most closely satisfy the relation $E[y_i(t)y_j(t)]=E[y_i(t)]E[y_j(t)]$ for any different indices i and j, where the operation E is a weighted average over a period of time of said value of $x_1(t), x_2(t), \ldots, x_n(t), y_1(t), y_2(t), \ldots, y_n(t)$.

7. The method of claim 6 wherein said choosing step of (e) and (h) computes an instantaneous performance value in accordance with:

$$C(t) = -\log (\Sigma_{ij}\{E[y_i(t)y_j(t)]\}^2),$$

and wherein the logarithm computation is protected against numerical overflow.

8. The method of claim 7 further comprising the step of:

generating said plurality of input signals by a plurality of transducer means, based upon waves received by said plurality of transducer means from a plurality of sources.

9. The method of claim 8 wherein said plurality of input signals is generated by a plurality of transducer means, based upon acoustic waves received by said plurality of transducer means from a plurality of sources.

10. The method of claim 8 wherein said plurality of input signals is generated by a plurality of transducer means, based upon electromagnetic waves received by said plurality of transducer means from a plurality of sources.

11. The method of claim 8 wherein said transducer means are directional and positioned to minimize relative propagation delays.

12. The method of claim 11 wherein each set of said plurality of signal parameters represents values of relative gains in transduction of said waves from said waves by said plurality of transducer means.

13. The method of claim 12 wherein said choosing steps (e) and (j) computes said instantaneous performance value in accordance with: $Y(t)=\text{inv } G*X(t)$, where X and Y are the vector representations of the signals $x_i(t)$ and $y_i(t)$, G is the matrix representation of said relative gains, and inv G is its inverse matrix.

14. The method of claim 13 wherein said choosing steps (e) and (j) comprises computing $Y(t)$ explicitly from the currently available input signals $X(t)$; and calculating said instantaneous performance value by operating on the values $Y(t)$ for at least a duration of time equal to the averaging time of the expectation operator $E[\ ]$.

15. The method of claim 13 further comprising the step of storing said plurality of input signals $X(t)$ for at least a duration of time equal to the averaging time of the expectation operator $E[\ ]$; and wherein said choosing steps (e) and (j) computes $Y(t)$ explicitly from said storage of input signals $X(t)$, and subsequently said instantaneous performance value.

16. The method of claim 13 wherein said choosing steps (e) and (j) comprises the steps of:

precalculating, once per clock cycle, the quantity $$e_{ij}=E\{x_i(t)x_j(t)\}$$

for every (i,j) pair; and computing said instantaneous performance value $C(t)$ as required, from the quantities $e_{ij}$.

17. The method of claim 8 wherein said plurality of signal parameters represent the coefficients of filters that model the transfer function of propagation of said waves from said plurality of sources to said plurality of transducer means; and said choosing steps (e) and (j) computes said instantaneous performance value in accordance with $Y(t)=\text{inv } H*X(t)$, where X and Y are the vector representations of the signals $x_i(t)$ and $y_i(t)$, H is the matrix representation of said filters, and inv H is its inverse matrix.

18. The method of claim 17 wherein said choosing steps (e) and (j) comprises the steps of:

computing Y(t) explicitly from the currently available input signals X(t); and calculating said instantaneous performance value by operating on the values Y(t) for at least a duration of time equal to the averaging time of the expectation operator E[ ] plus the longest duration of said filters.

19. The method of claim 17 further comprising the step of storing said plurality of input signals X(t) for at least a duration of time equal to the averaging time of the expectation operator E[ ] plus the longest duration of said filters; and wherein said choosing steps (e) and (j) computes Y(t) explicitly from said storage of input signals X(t), and subsequently said instantaneous performance value.

20. The method of claim 17 wherein said choosing steps (e) and (j) comprises the steps of:

precalculating, once per clock cycle, the quantity $e_{ij}(k_i, k_j)=E\{x_i(t-k_i\Delta t)x_j(t-k_j\Delta t)\}$ for every (i, j) pair, and for each such pair, for every $(k_i,k_j)$ pair; and computing C(t) from the quantities $e_{ij}(k_i,k_j)$ every time the instantaneous performance value is required.

21. The method of claim 8 wherein said transducer means are spaced apart and omnidirectional; and wherein said plurality of signal parameters represent values of relative delays in propagation of said waves from said plurality of sources to said plurality of transducer means; and wherein said choosing steps (e) and (j) computes said instantaneous performance value using the definition $Y(t)=\text{adj } D*X(t)$, where X and Y are the vector representations of the signals $x_i(t)$ and $y_i(t)$, D is the matrix representation of said relative delays, and adj D is its adjugate matrix.

22. The method of claim 21 wherein said choosing steps (e) and (j) comprises the steps of: computing Y(t) explicitly from the currently available input signals X(t); and calculating said instantaneous performance value by operating on the values Y(t) for at least a duration of time equal to the averaging time of the expectation operator E[ ] plus the maximum value of said relative delays.

23. The method of claim 21 further comprising the step of storing said plurality of input signals X(t) for at least a duration of time equal to the averaging time of the expectation operator E[ ] plus the maximum value of said relative delays; and wherein said choosing steps of (e) and (j) computes Y(t) explicitly from said storage of input signals X(t), and subsequently said instantaneous performance value.

24. The method of claim 22 wherein said choosing steps (e) and (j) comprises the steps of:

precalculating, once per clock cycle, the quantity $e_{ij}(k_i, k_j)=E\{x_i(t-k_i\Delta t)x_j(t-k_j\Delta t)\}$ for every (i,j) pair, and for each such pair, for every $(k_i,k_j)$ pair; and computing C(t), as is required, from the quantities $e_{ij}(k_i,k_j)$ by implementing the necessary time delays using linear-phase, non-causal FIR filters with a truncated sinc-shaped impulse response.

25. A method of processing waves from a plurality of sources, comprising:

receiving said waves, including echoes and reverberations thereof, by a plurality of transducer means;

converting said waves, including echoes and reverberations thereof from said plurality of sources, by each of said plurality of transducer means into a signal, thereby generating a plurality of signals;

calculating a set of a plurality of signal parameters by:

generating a fixed plurality of sets of a plurality of signal parameters;

storing said fixed plurality of sets;

generating a plurality of instantaneous performance values for each set, with each instantaneous performance value generated at a different time;

combining said plurality of instantaneous performance values for each set to produce a plurality of cumulative performance values, with a cumulative performance value produced for each set;

storing said plurality of cumulative performance values;

periodically generating a new set of a plurality of signal parameters;

generating a new cumulative performance value, based upon said new set;

comparing said new cumulative performance value to said plurality of stored cumulative performance values;

based upon said comparing step, either:

i) replacing one of said stored plurality of cumulative performance values, by said new cumulative performance value, and the corresponding stored set by said new set; or ii) deleting said new cumulative value and said new set;

comparing said stored plurality of cumulative performance values;

choosing one of said stored plurality of cumulative performance values, based upon said comparison;

choosing one set, corresponding to said chosen one cumulative performance value;

supplying said chosen one set to a first processing means for operation thereon;

first processing said plurality of signals, using said chosen one set, corresponding to said chosen one cumulative performance value, to generate a plurality of first processed signals, wherein each of said first processed signals represents waves from one source, and a reduced amount of waves from other sources; and then secondly processing said plurality of first processed signals to generate a plurality of second processed signals, wherein in the presence of echoes and reverberations of said waves from said plurality of sources, each of said second processed signals represents waves from only one different source.

26. The method of claim 25 wherein said transducer means are spaced apart omnidirectional microphones, and said chosen one set of plurality of signal parameters has a set of relative delay parameters associated therewith; said first processing step further comprises:

delaying said plurality of signals using said set of relative delay parameters and generating a plurality of delayed signals in response thereto; and combining each one of said plurality of signals with at least one of said plurality of delayed signals to produce one of said first processed signals.

27. The method of claim 26 further comprising the step of:
filtering each of said second processed signals to generate a plurality of third processed signals.

28. The method of claim 27 further comprising the step of:
sampling and converting each one of said plurality of signals and for supplying same to said plurality of delay means and to said plurality of combining means, as said signal.

29. The method of claim 25 wherein said second processing step further comprising:
subtracting by a plurality of combining means one of said first processed signals received at said first input, and the sum of input signals received at a second input, to produce an output signal, said output signal being one of said plurality of second processed signals;
generating a plurality of adaptive signals, with each of said adaptive signals being the output signal of one of said plurality of combining means; and
supplying each of said plurality of adaptive signals to second input of said plurality of combining means other than the associated one combining means.

30. The method of claim 25, wherein said step of generating a new set comprises arithmetically combining random values from a pseudorandom number generator, one set in said plurality of sets, and recent values of said plurality of input signals.

31. The method of claim 30 wherein:
said comparing step compares the cumulative performance value of said new set with the cumulative performance value of one of said stored plurality of sets having a least cumulative performance value;
and wherein said replacing step replaces one of said stored plurality of sets having said least cumulative performance value.

32. The method of claim 31 wherein: said replacing step further comprises:
generating an initial cumulative performance value for said new set by subtracting a fixed value from a cumulative performance value of one of said stored plurality of sets having the greatest cumulative performance value; and
wherein said comparing step chooses one of said stored plurality of sets having the greatest cumulative performance value, for processing by said processing step.

33. An adaptive filter for determining a set of a plurality of signal parameters for use in an adaptive filter signal processor to process a plurality of input signals to generate a plurality of processed signals, said filter comprising:
means for generating a fixed plurality of sets;
means for storing said fixed plurality of sets;
means for generating a plurality of cumulative performance values, based upon said fixed plurality of sets, with a cumulative performance value generated for each set;
means for evaluating said plurality of cumulative performance values, and choosing one of said plurality of cumulative performance values, based upon said evaluation; and
means for processing said plurality of input signals for a duration of time using one set, corresponding to said chosen one cumulative performance value, from said fixed plurality of stored sets to generate the plurality of processed signals.

34. The filter of claim 33, further comprises:
means for periodically generating a new set of a plurality of signal parameters;
means for generating a new cumulative performance value, for each set of signal parameters, including said new set generated;
means for comparing said new cumulative performance value corresponding to said new set generated to said cumulative performance values for each set of signal parameters; and
means for either i) replacing one of said fixed number of plurality of said sets, by said new set; or
ii) deleting said new set, in response to said comparing means.

35. The filter of claim 34 further comprises:
means for generating a plurality of instantaneous performance values for each set, with each instantaneous performance value generated at a different time; and
means for combining said plurality of instantaneous performance values for each set to produce a plurality of cumulative performance values, with a cumulative performance value produced for each set.

36. The filter of claim 35, wherein said means for generating a new cumulative performance value comprises means for arithmetically combining random values from a pseudorandom number generator, one set in said plurality of sets, and recent values in said plurality of input signals.

37. The filter of claim 36 wherein:
said evaluating means compares instantaneous performance value of said new set with instantaneous performance value of one of said stored plurality of sets having a least instantaneous performance value;
and wherein said replacing means replaces one of said stored plurality of sets having said least instantaneous performance value.

38. The filter of claim 37 wherein:
said means for generating a new cumulative performance value further comprises means for generating an initial cumulative performance value for said new set and means for subtracting a fixed value from a cumulative performance value of one of said stored plurality of sets having the greatest cumulative performance value; and
wherein said evaluating means comprises means for choosing one of said stored plurality of sets having the greatest cumulative performance value, for processing by said processing means.

39. A signal processing system for processing waves from a plurality of sources, said system comprising:
a plurality of transducer means for receiving waves from said plurality of sources, including echoes and reverberations thereof and for generating a plurality of signals in response thereto, wherein each of said plurality of transducer means receives waves from said plurality of sources including echoes and reverberations thereof, and for generating one of said plurality of signals;
means for calculating a set of a plurality of signal parameters, said calculating means comprising:
means for generating a fixed plurality of sets of signal parameters;
means for storing said fixed plurality of sets of signal parameters;
means for generating a plurality of cumulative performance values, based upon said fixed plurality of sets of signal parameters, with a cumulative performance value generated for each set of signal parameters;
means for evaluating said plurality of cumulative performance values, and choosing one of said plurality of cumulative performance values, based upon said evaluation, and one of said sets of signal parameters corresponding to said one of said plurality of cumulative performance values chosen;

first processing means for receiving said plurality of signals, and said plurality of signal parameters of said set chosen for generating a plurality of first processed signals in response thereto, wherein each of said first processed signals represents waves from one source, and a reduced amount of waves from other sources; and second processing means for receiving said plurality of first processed signals and for generating a plurality of second processed signals in response thereto, wherein each of said second processed signals represents waves from only one source.

40. The system of claim 39, further comprising:

means for generating a direction of arrival signal for said waves;

wherein said first processing means for generating said plurality of first processed signals, in response to said direction of arrival signal.

41. The system of claim 39, wherein the number of transducer means is two, and the number of sources is two.

42. The system of claim 39, wherein said transducer means are spaced apart omnidirectional microphones and wherein said chosen one set of plurality of signal parameters has a set of relative delay parameters, and said first processing means comprises:

a plurality of delay means, each for receiving one of said plurality of signals and using said set of relative delay parameters for generating a plurality of delayed signals in response thereto; and a plurality of combining means, each for receiving at least one delayed signal and one of said plurality of signals and for combining said received delayed signal and said signal to produce one of said first processed signals.

43. The system of claim 39 wherein said plurality of transducer means are co-located directional microphones and wherein said one of said set of signal parameters has a set of gain parameters associated therewith, and wherein first processing means comprises:

a plurality of multiplying means, each for receiving different ones of said plurality of signals and said set of gain parameters and for generating a scaled signal in response thereto; and a plurality of combining means, each for receiving at least one scaled signal and one of said plurality of signals and for combining said received scaled signal and said signal to produce one of said first processed signals.

44. The system of claim 39, 40, 41, 42, or 43 wherein said second processing means comprises:

a plurality of combining means, each combining means having a first input, at least one other input, and an output; each of said combining means for receiving one of said first processed signals at said first input, an input signal at said other input, and for generating an output signal, at said output; said output signal being one of said plurality of second processed signals and is a difference between said first processed signal received at said first input and the sum of said input signal received at said other input;

a plurality of adaptive filter means for generating a plurality of adaptive signals, each of said adaptive filter means for receiving said output signal from one of said plurality of combining means and for generating an adaptive signal in response thereto; and means for supplying each of said plurality of adaptive signals to one of said other input of said plurality of combining means other than the associated one combining means.

45. The system of claim 44 further comprising means for filtering each of said second processed signals to generate a plurality of third processed signals.

46. The system of claim 45 wherein said second processed signals are characterized by having a low frequency component and a high frequency component, and wherein said filtering means boosts the low frequency component relative to the high frequency component of said second processed signals.

47. A signal processing system for processing waves from a plurality of sources, said system comprising:

a plurality of transducer means for receiving waves from said plurality of sources, including echoes and reverberations thereof and for generating a plurality of signals in response thereto, wherein each of said plurality of transducer means receives waves from said plurality of sources including echoes and reverberations thereof, and for generating one of said plurality of signals;

an adaptive filter for generating a plurality of signal parameters, said filter comprising:

means for generating a fixed plurality of sets of signal parameters;

means for storing said fixed plurality of sets of signal parameters;

means for generating a plurality of cumulative performance values, based upon said fixed plurality of sets of signal parameters, with a cumulative performance value generated for each set;

means for evaluating said plurality of performance values, and choosing one of said plurality of performance values and its corresponding set of plurality of signal parameters, based upon said evaluation;

first processing means for receiving said plurality of signals and said plurality of signal parameters and for generating a plurality of first processed signals in response thereto, wherein in the absence of echoes and reverberations of said waves from said plurality of sources, each of said first processed signals represents waves from only one different source; and second processing means for receiving said plurality of first processed signals and for generating a plurality of second processed signals in response thereto, wherein in the presence of echoes and reverberations of said waves from said plurality of sources, each of said second processed signals represents waves from only one source.

48. The system of claim 47 wherein said waves are acoustic waves, and said transducer means are microphones.

49. The system of claim 48 further comprising means for filtering each of said second processed signals to generate a plurality of third processed signals.

50. The system of claim 49 wherein said second processed signals are characterized by having a low frequency component and a high frequency component and wherein said filtering means boosts the low frequency component relative to the high frequency component of said second processed signals.

51. The system of claim 49 wherein said microphones are spaced apart omnidirectional microphones and wherein said corresponding set of signal parameters has a set of relative delay parameters associated therewith; and said first processing means comprises:

a plurality of delay means, each for receiving one of said plurality of signals and said set of relative delay parameters and for generating a delayed signal in response thereto; and a plurality of combining means, each for receiving at least one delayed signal and one of said plurality of signals and for combining said received delayed signal and said signal to produce one of said first processed signals.

52. The system of claim 48 wherein said microphones are co-located directional microphones wherein said corresponding set of signal parameters has a set of gain parameters associated therewith; and said first processing means comprises:

a plurality of multiplying means, each for receiving different ones of said plurality of signals and said set of gain parameters and for generating a scaled signal in response thereto; and a plurality of combining means, each for receiving at least one scaled signal and one of said plurality of signals and for combining said received scaled signal and said signal to produce one of said first processed signals.

53. The systems of claims 47, 48, 49, 50, 51 or 52, wherein said second processing means comprises:

a plurality of combining means, each combining means having a first input, at least one other input, and an output; each of said combining means for receiving one of said first processed signals at said first input, an input signal at said other input, and for generating an output signal, at said output; said output signal being one of said plurality of second processed signals and is a difference between said first processed signal received at said first input and the sum of said input signal received at said other input;

a plurality of adaptive filter means for generating a plurality of adaptive signals, each of said adaptive filter means for receiving said output signal from one of said plurality of combining means and for generating an adaptive signal in response thereto; and means for supplying each of said plurality of adaptive signals to one of said other input of said plurality of combining means other than the associated one combining means.

54. The system of claim 53 wherein each of said adaptive filter means comprises a tapped delay line.

55. An adaptive filter signal processing system for processing waves from a plurality of sources, said system comprising:

a plurality of transducer means for receiving waves from said plurality of sources, including echoes and reverberation thereof and for generating a plurality of signals in response thereto, wherein each of said plurality of transducer means receives waves from said plurality of sources including echoes and reverberations thereof, and for generating one of said plurality of signals;

an adaptive filter for generating a plurality of signal parameters, said filter comprising:

means for generating a fixed plurality of sets of signal parameters;

means for storing said fixed plurality of sets signal parameters;

means for generating a plurality of performance values, based upon said fixed plurality of sets of signal parameters, with a performance value generated for each set;

means for evaluating said plurality of performance values, and choosing one of said plurality of performance values, and its corresponding set of signal parameters, based upon said evaluation;

first processing means comprises a beamformer for receiving said plurality of signals and said plurality of signal parameters, and for generating a plurality of first processed signals in response thereto, wherein each of said first processed signals represents waves from one source, and a reduced amount of waves from other sources; and second processing means for receiving said plurality of first processed signals and for generating a plurality of second processed signals in response thereto, wherein each of said second processed signals represent waves from only one source.

56. The system of claim 55, wherein said transducer means are spaced apart omnidirectional microphones and said corresponding set of signal parameters has a set of delay parameters associated therewith, and wherein said first processing means comprises:

a plurality of delay means, each for receiving one of said plurality of signals and said set of delay parameters, and for generating a delayed signal in response thereto; and a plurality of combining means, each for receiving at least one delayed signal and one of said plurality of signals and for combining said received delayed signal and said signal to produce one of said first processed signals.

57. The system of claim 55 wherein said second processing means comprises:

a plurality of combining means, each combining means having a first input, at least one other input, and an output; each of said combining means for receiving one of said first processed signals at said first input, an input signal at said other input, and for generating an output signal, at said output; said output signal being one of said plurality of second processed signals and is a difference between said first processed signal received at said first input and the sum of said input signal received at said other input;

a plurality of adaptive filter means for generating a plurality of adaptive signals, each of said adaptive filter means for receiving said output signal from one of said plurality of combining means and for generating an adaptive signal in response thereto; and means for supplying each of said plurality of adaptive signals to one of said other input of said plurality of combining means other than the associated one combining means.

58. The system of claims 55, 56, or 57, wherein said first processing means comprises analog circuits.

59. The system of claims 55, 56, or 57, wherein said second processing means comprises analog circuits.

60. The system of claims 55, 56, or 57, wherein said first processing means are a part of a digital signal processor.

61. The system of claims 55, 56, or 57, wherein said second processing means are a part of a digital signal processor.

62. The system of claims 55, 56, or 57, wherein said first processing means are a part of a general purpose computer.

63. The system of claims 55, 56, or 57, wherein said second processing means are a part of a general purpose computer.

64. The system of claims 55, 56, or 57, wherein said first processing means are reconfigurable gate array circuits.

65. The system of claims 55, 56, or 57, wherein said second processing means are reconfigurable gate array circuits.

66. The system of claim 55, further comprising:

a plurality of third processing means for receiving said plurality of second processed signals and for removing frequency coloration therefrom.

67. The system of claim 56 further comprising:

a plurality of sampling digital converting means, each for receiving a different one of said plurality of signals and for generating a digital signal; said digital signal supplied to said plurality of delay means and to said plurality of combining means, as said signal.

68. The system of claims 55, 56, or 57 further comprises:

means for periodically generating a new set of a plurality of signal parameters;

means for generating a new cumulative performance value, for each of said sets, including said new set;

means for comparing said new cumulative performance values; and switch means for either i) replacing one of said fixed number of plurality of said sets, by said new set; or ii) deleting said new set, in response to said comparing means.

69. The system of claim 68 further comprises:

means for generating a plurality of instantaneous performance values for each of said fixed plurality of sets, with each instantaneous performance value generated at a different time;

means for combining said plurality of instantaneous performance values for each set to produce a plurality of cumulative performance values, with a cumulative performance value produced for each set.

70. The system of claim 69, wherein said means for generating a new cumulative performance value for each of said sets, including said new set, comprises means for arithmetically combining random values from a pseudorandom number generator, one set in said plurality of sets, and recent values in said plurality of input signals.

71. The system of claim 70 further comprises:

means for generating a plurality of instantaneous performance values for each of said sets, including said new set, with each instantaneous performance value generated at a different time; and wherein:

said comparing means compares instantaneous performance value of said new set with instantaneous performance value of one of said stored plurality of sets having a least instantaneous performance value;

and wherein said replacing means replaces one of said stored plurality of sets having said least instantaneous performance value.

72. The system of claim 68 further comprises means for generating an initial cumulative performance value for said new set and means for subtracting a fixed value from a cumulative performance value of one of said stored plurality of sets having the greatest cumulative performance value; and wherein said comparing means comprises means for choosing one of said stored plurality of sets having the greatest cumulative performance value, for processing by said processing means.

* * * * *